United States Patent [19]

Suzuki et al.

[11] Patent Number: 5,485,004
[45] Date of Patent: Jan. 16, 1996

[54] PHOTOSENSOR DEVICE INCLUDING MEANS FOR DESIGNATING A PLURALITY OF PIXEL BLOCKS OF ANY DESIRED SIZE

[75] Inventors: Kenji Suzuki, Kawasaki; Mamoru Miyawaki, Tokyo; Akira Akashi, Yokohama; Toshiki Nakayama, Atsugi, all of Japan

[73] Assignee: Canon Kabushiki Kaisha, Tokyo, Japan

[21] Appl. No.: 432,726

[22] Filed: May 2, 1995

Related U.S. Application Data

[63] Continuation of Ser. No. 186,887, Jan. 26, 1994, abandoned, which is a continuation of Ser. No. 90,260, Jul. 13, 1993, abandoned, which is a division of Ser. No. 789,045, Nov. 7, 1991, Pat. No. 5,241,167.

[30] Foreign Application Priority Data

Nov. 7, 1990 [JP] Japan ................................. 2-303398
Nov. 8, 1990 [JP] Japan ................................. 2-304949

[51] Int. Cl.$^6$ ............................................. H01J 40/14
[52] U.S. Cl. .................................. 250/208.2; 250/201.8
[58] Field of Search ........................... 250/208.1, 208.2, 250/201.8, 204, 558; 354/402, 406, 407, 408; 382/31, 32, 42

[56] References Cited

U.S. PATENT DOCUMENTS

| | | | |
|---|---|---|---|
| 3,997,795 | 12/1976 | Pohl et al. | 250/558 |
| 4,025,785 | 5/1977 | Mueller | 250/558 |
| 4,460,260 | 7/1984 | Utagawa | 354/406 |
| 4,601,053 | 7/1986 | Grumet | 250/558 |
| 4,643,557 | 2/1987 | Ishizaki et al. | 354/406 |
| 4,812,869 | 3/1989 | Akashi et al. | 354/408 |
| 4,952,963 | 8/1990 | Akashi | 354/402 |
| 4,954,701 | 9/1990 | Suzuki et al. | 250/201.8 |
| 5,022,087 | 6/1991 | Peppers et al. | 382/32 |
| 5,051,833 | 9/1991 | Tsuji | 358/227 |
| 5,107,337 | 4/1992 | Ueda et al. | 358/227 |
| 5,121,152 | 6/1992 | Wagner | 384/402 |
| 5,241,167 | 8/1993 | Suzuki et al. | 250/201.8 |

FOREIGN PATENT DOCUMENTS

| | | |
|---|---|---|
| 63-11906 | 1/1988 | Japan . |
| 63-17209 | 7/1988 | Japan . |
| 1-27116 | 10/1989 | Japan . |

*Primary Examiner*—Stephone B. Allen
*Attorney, Agent, or Firm*—Fitzpatrick, Cella, Harper & Scinto

[57] ABSTRACT

A photoelectric sensor device has a two-dimensional arrangement of a multiplicity of unit structures each including a pixel. The sensor device includes a circuit for simultaneously designating a plurality of pixel blocks of any desired sizes at any desired positions on the two dimensional arrangement of unit structures, each pixel block being composed of pixels which are to be actually used. The sensor device also includes a monitor output circuit for outputting, for each of the pixel blocks, at least one monitor output as the representative of the amounts of charges accumulated in the pixels in each of the pixel blocks. The sensor device further includes a circuit which executes the control of accumulation of charges and the control of outputting of the image signals on each of the pixel blocks independently of other pixel blocks. Disclosed also is a focus detection system using the sensor device.

39 Claims, 13 Drawing Sheets

PHOTOSENSOR DEVICE INCLUDING MEANS FOR DESIGNATING A PLURALITY OF PIXEL BLOCKS OF ANY DESIRED SIZE

This application is a continuation, of application Ser. No. 08/186,887 filed Jan. 26, 1994, now abandoned, which is a continuation of Ser. No. 08/090,260, filed Jul. 13, 1993, now abandoned, which is a divisional of Ser. No. 07/789,045, filed on Nov. 7, 1991, now U.S. Pat. No. 5,241,167.

BACKGROUND OF THE INVENTION

1. Field of the Invention

The present invention relates to a photoelectric conversion device and, more particularly, to a photoelectric sensor which is used in an automatic focusing system which focuses an optical system of a photographing or other devices at any desired point in a photographing or imaging frame.

2. Related Background Art

An automatic focus detection system has been proposed which enables automatic focusing at a plurality of points or any desired point within a photographing frame. This system can be realized either by a so-called contrast detection type method or a so-called two-image phase differential detection system. Anyway, in a passive-type system which detects an in-focus state by a computation on the basis of a measured light quantity distribution of a subject, it is necessary to employ a sensor array for determining the above-mentioned light quantity distribution.

An automatic focusing system for detecting focus on a plurality of points by utilizing a passive technique has been already realized in the field of single-lens reflex cameras. Such a system employs a linear sensor array for each of a finite number of focus detection points. In order to reduce the production cost, these sensor arrays are integrated on a single chip. Practical arrangements of such sensor arrays are disclosed, for example, in Japanese Patent Laid-Open Application Nos. 63-11906, 63-172209 and 1-271716.

A known focus detection optical system will be described with specific reference to FIGS. 1A and 1B. This known optical system has a field lens 20, a multi-slit field mask 21, a secondary image-forming lens 22 composed of a pair of positive lenses arranged side by side, and a sensor device 23 having a plurality of pairs of photoelectric sensor arrays. The multi-slit field mask 21 is positioned in the vicinity of an expected imaging plane of an objective lens (not shown), and has slits 21a, 21b and 21c which determine respective range-finding fields. The secondary image forming lens 22 focuses, for example, a portion of the subject image defined by the slit 21a substantially on the the sensor array pair 23a, 23b.

Likewise, the subject image portions defined by the slits 21b and 21c are focused substantially on the sensor array pairs 23c, 23d and 23e, 23f, respectively. Pieces of information concerning light quantities, received by the respective sensor arrays, are read as electrical signals and are subjected to a correlation computation so that a value indicative of state of focusing of the object lens on the subject image in the range-finding field, defined by each slit, is determined. The range-finding fields defined by the three slits can be set in an imaging frame 27 at 29L, 29C and 29R, as shown in FIG. 1B.

When only few focus detecting position are used as in the described system, it is possible to provide linear sensor arrays corresponding to the respective focus detecting positions, on a single chip in a discrete manner, as is the case of the sensor device 23. In such a case, a device of high scale of integration can be obtained because the regions between adjacent sensor arrays can be used as the spaces for installing logic and analog circuits which would support functions of the sensor arrays.

This way of integration, however, cannot suitably be used when a greater number of focus detection points are arranged more densely. This is because each linear sensor array has to be assisted by various additional circuits other than sensor pixels. For instance, it is necessary to provide, for each of the sensor arrays, a temporary accumulation means for serially outputting photo-charge information which has been stored in a batch manner, a serial information transfer system, a shift register for performing clocking to enable the information to be read sequentially, and so forth. In general, such additional circuits require much greater installation area than the sensor arrays. As a consequence, the number of the sensor arrays which can be constructed in one chip is strictly limited.

In order to attain a greater number of sensor arrays, i.e., a higher density of sensor arrays, it is preferred to use a so-called area sensor in which sensor cells are regularly arranged two-dimensionally. State of focusing on a specific subject position can be detected by computing information from pixels in a suitable portion of the light-receiving area in the area sensor. Focus detection relying upon an area sensor has already been put to use in the fields of TV cameras and VTR-integrated cameras, which employ electronic imaging devices, because the imaging device employing an area sensor can also serve as the focus detection sensor. In such a case, however, the use of an area sensor is not intended for multi-focus detection but is employed for the purpose of reducing the cost of the apparatus.

FIG. 2 shows an example of the optical apparatus having an area sensor array which serves both as imaging device and a focusing sensor. A focus lens 1 is adapted to be driven by a focus motor 2. A solid-state imaging device 4 is attached to the center of the bimorph 3. The solid-state imaging device 4 performs photoelectric conversion of optical image information formed by the focus lens 1, and has a large number of pixels, typically 100,000 to 500,000 pixels. Electrical signals thus obtained are supplied to a. video signal processing system (not shown) which produce video signals. A bimorph 3 is driven by power from a bimorph driving circuit 8 and is adapted to oscillate the solid-state imaging device 4 in the direction of the optical axis. The output signal from the solid-state imaging device 4 is delivered to a defocus detection circuit 10 which detects, during the axial oscillation of the solid-state imaging device 4, whether the focus is in front of or behind the subject, and produces a signal to activate the focus motor 2 so as to move the focus lens 1 in such a direction as to reduce the amount of defocus.

In general, a photographing frame contains the major subject to be photographed and background. It is, therefore, necessary to define, by suitable measure, the area to be picked up by the defocus detection circuit out of the entire area of the imaging frame. Conventionally, the area or portion to be used as the object of the focus detection is defined in a central region of the imaging frame. Alternatively, a framework of a predetermined size is set to surround the center of the imaging frame and the focus detection is conducted on a point which exhibits the highest contrast within the area defined by the framework.

Known focus detection systems employing area sensors composed of two-dimensionally arranged pixels, however, suffer from, various drawbacks or shortcomings as stated below, so that they can not satisfactorily perform a high degree of function for comparing and evaluating states of focusing on a multiplicity of focus detection points in a frame.

Firstly, it is to be understood that an ordinary imaging area sensor does not have any means for enabling a random access to information concerning local portions of the subject image in the imaging free. Multi-focus detection requires that pieces of image information derived from different focus detection points are quickly calculated for the purpose of comparison and evaluation, and the results of the computation are used in the focus control operation. The above-mentioned computation is performed by a hardware based upon a microprocessor or a digital circuit such as a DSP and, therefore, essentially requires an A/D converter, for converting the image information, and a digital memory in which the converted data is to be stored. Data sampling from plural focus detection points is greatly facilitated in terms of the system hardware structure, memory capacity, speed of A/D converter, and so forth, when suitable means are provided for enabling a random access to the data available from these focus detection points. Unfortunately, however, a conventional area sensor does not have a function for reading data from designated focus detection blocks in a random manner. It is impossible to realize a focus detection system with such area sensors. This problem is serious particularly in the focus detection system of the phase differential type which essentially requires photoelectric outputs of two optical images which are formed from the same subject through different optical paths. To this end, it is necessary to employ a sensor device which can control a pair of discrete image blocks in synchronization, In ordinary area sensors, the data on the entire area of the sensor are read at a constant high clock speed and the required data is picked up during the reading. In addition, the timing of the reading is undesirably limited due to hardware. As a consequence, an impractically long time is required for the system to obtain the result. Thus, the known area sensors cannot provide satisfactory performance. In addition, the known area sensor, which has no function for enabling a random access to local portions of the image area, cannot comply with a significant demand by the photographer who often wishes to change, in a random manner, the point at which the lens is to be focused, depending on factors such as the focal point of the photographing lens or the type of the subject.

Secondly, it is to be pointed out that the known area sensor does not have a function for optimizing the signal charge accumulation on each of a plurality of focus detection points which usually have different levels of luminance and contrast. In general, persons, sceneries and other photographing or video-imaging subjects have wide variations of light quantity. Namely, light quantity largely vary according to portions of such subject. The portion of the photographer's interest is not always the portion which has the highest luminance. For instance, it is often experienced that the luminance of background is 10 to $10^2$ greater than that of the face of a person as the subject. When a reelection of sunlight exists in the background, the luminance level of the background may be $10^3$ greater than that of the major subject. Therefore, when an area sensor is used in a focus detection system having a multiplicity of focus detection points, it is necessary that the control of the accumulation of signal charges and the gain of the amplifier for reading are optimally controlled for each of different points of focus detection. This requirement is not met by ordinary silicon photoelectric sensors which are used at normal temperatures and which have a dynamic range as small as $10^2$ to $10^3$. Namely, it is impossible to conduct a control over the entire imaging area in response to the wide variation in the luminance, while maintaining required levels of S/N ratio on all the points of focus detection. Namely, when the known area sensor is used, the photographing lens is focused on a point which has the highest level of luminance. Consequently, a portion with a high level of luminance or contrast is preferentially focused regardless of the photographer's intention.

It is also to be pointed out that a higher density in the arrangement of the focus detection points essentially requires a reduction in the pixel size in each photoelectric sensor. As a consequence, the quantity of light distributed to each image block for focus detection is reduced to affect the focus detection performance particularly in the low-luminance range. Thus, the lower limit of luminance for focus detection, as well as effective reach of any auxiliary illuminating means, is reduced when the known area sensor is used in a multi-point focus detection system.

SUMMARY OF THE INVENTION

Accordingly, an object of the present invention is to provide a sensor device which can eliminate the above-described drawbacks or shortcomings of the known art.

Another object of the present invention is to provide an automatic focus detection system which incorporates the above-mentioned sensor device.

To this end, according to one aspect of the present invention, there is provided a photoelectric sensor device having a two-dimensional arrangement of a multiplicity of unit structures each including a pixel. The sensor device comprises: means for simultaneously designating a plurality of pixel blocks, of any desired sizes at any desired positions, on the two-dimensional arrangement of unit structures, each pixel block being composed of pixels which are to be actually used. The sensor device further comprises monitor output circuit for outputting, for each of the pixel blocks, at least one monitor output as the representative of the amounts of charges accumulated in the pixels in each of the pixel blocks; and means for executing the control of accumulation of charges and the control of outputting of the image signals on each of the pixel blocks independently of other pixel blocks.

According to another aspect of the present invention, there is provided an automatic focus detection system which has, in combination with the sensor device described above, an automatic focus detection optical system which forms, on the sensor device, the image of a part or whole of the image in the photographing frame, wherein, prior to the start of operation of the photoelectric sensor device, portions of the image to be focused are designated in terms of pixel blocks on the sensor device, and photoelectric charges are accumulated in the pixel blocks in accordance with the monitor outputs in independent pixel blocks, the results of accumulation being read serially and arithmetically processed to enable focusing of the photographing system.

This aspect of the invention provides an automatic focus detecting function of a high degree, with an area sensor having arrangement of the pixels, thus overcoming the above-described problems of the known art.

In a specific form of the photoelectric sensor device of the present invention, each of the unit structures includes a RAM having at least one bit, and a pixel block designating means, which designates the pixel blocks by writing data in the RAMs of the pixels that are to be actually used. The simultaneous setting or designation of a plurality of pixel blocks is possible at any desired position on the sensor, and the control of charge accumulation and the control the outputting of the image signal are conducted under optimum conditions.

In a specific form of the automatic focus detection system of the present invention, light beams are applied through an automatic focusing optical system onto the sensor device so as to form whole or a part of the image to be photographed. In advance of the start of operation of the photoelectric sensor, the areas to be used for focus detection are designated as the above-mentioned pixel blocks. Accumulation of charges are conducted on each pixel block independently the other pixel blocks, and the results of accumulation are read serially and arithmetically processed to enable automatic focus detection.

This aspect of the invention provides an automatic focus detecting function of a high degree, with an area sensor having a two-dimensional arrangement of the pixels, thus overcoming the above-described problems of the known arts.

The above and other objects, features and advantages of the present invention will become clear from the following description of the preferred embodiments when the same is read in conjunction with the accompanying drawings.

DETAILED DESCRIPTION OF THE PREFERRED EMBODIMENTS

Preferred embodiments of the present invention will be described with reference to the drawings.

Figure 1A:
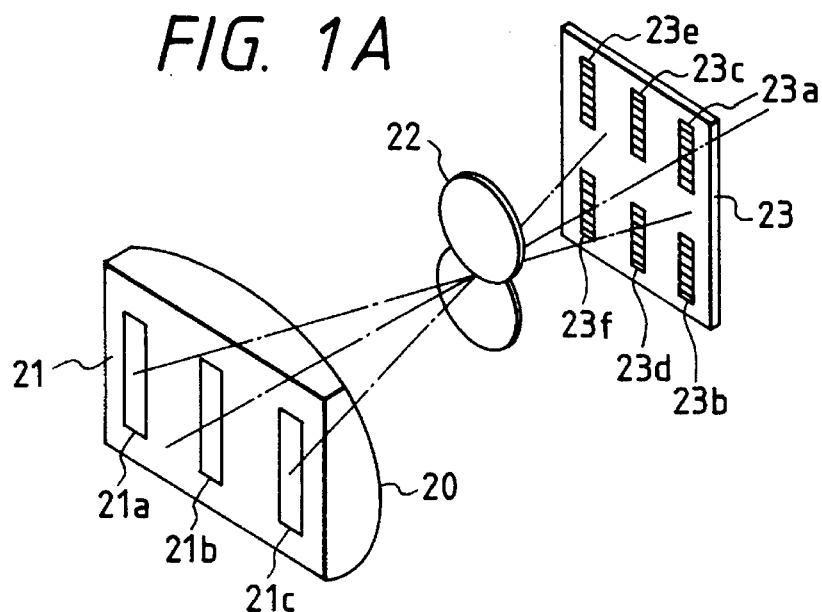
FIGS. 1A and 1B are schematic illustrations of a conventional focus detection system employing a conventional photoelectric sensor device.
Figure 1B:
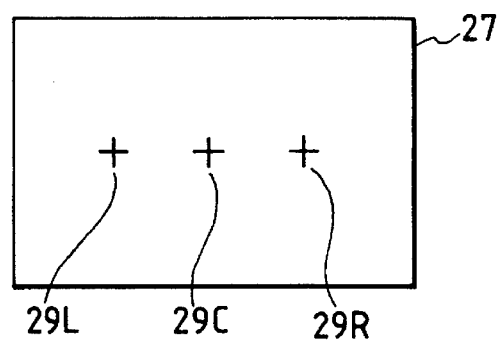
Figure 2:
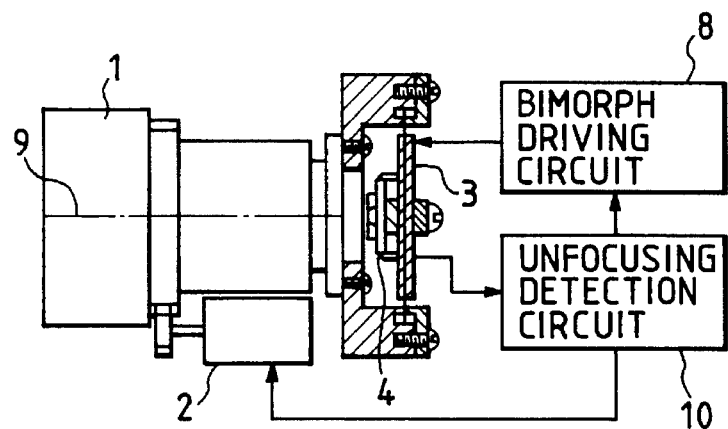
FIG. 2 is an illustration of a known focus detection system which employs an area sensor.

FIG. 3 shows a first embodiment of the present invention which is based substantially on the same principle as that of the known art described before in connection with FIGS. 1A and 1B. In FIG. 3, therefore, the same reference numerals are used to depict the same parts as those in FIGS. 1A and 1B. A field mask plate 21 is disposed in the vicinity of an expected imaging plane of a photographic objective lens (not shown). A single wide field slit 21R defines the area within which the focus detection is to be performed. A secondary imaging lens 22 composed of a pair of positive lenses focuses, on a pair of area sensors 23P, 23Q, a subject image which is defined by the slit 21R. Pieces of information concerning light quantities on corresponding local portions of the area sensor pair 23P, 23Q are read in the form of electrical signals representing local image information and are subjected to a correlation computation so that the values of the state of focusing of the objective lens on every portion of the subject image are computed. An aperture plate 24, which is disposed on the light-incident side of the secondary imaging lens 22, has apertures 24P and 24Q each of which controls the light beam incident to the corresponding positive lens of the secondary imaging lens 22. The aperture plate 24 is disposed substantially in focusing relation to the photographic objective lens at the position of the pupil of the objective lens in accordance with the power of a field lens 20.

The area sensor 23 has the following functions. (1) A function for enabling selection or designation of a plurality of areas for focus detection at any desired positions in the imaging region. (2) A function for detecting a peak value of light quantity in each of the designated areas. (3) A function for adding light quantity signals in the direction perpendicular to the direction of pixels detecting peak values.

Figure 3A:
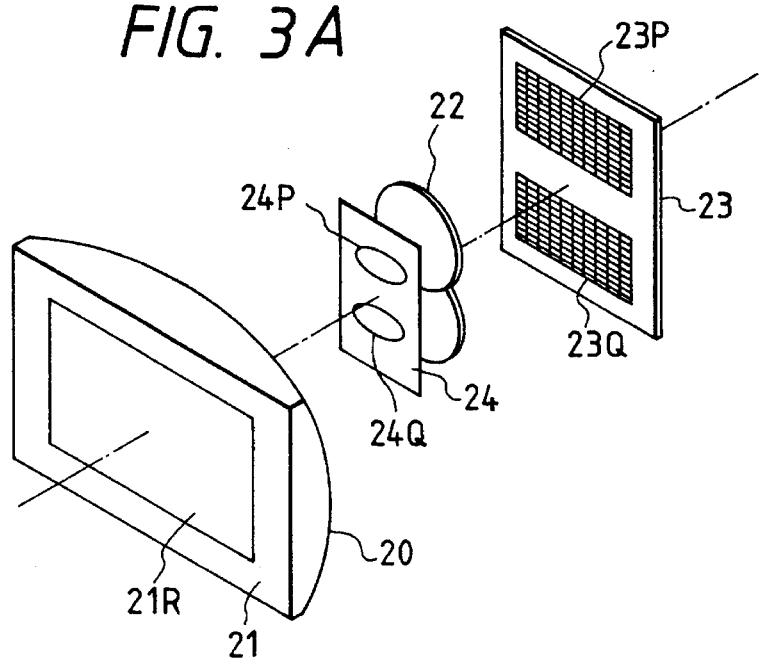
FIG. 3A is an illustration of an optical system used in a focus detection system employing an area sensor of the present invention.
Figure 3B:
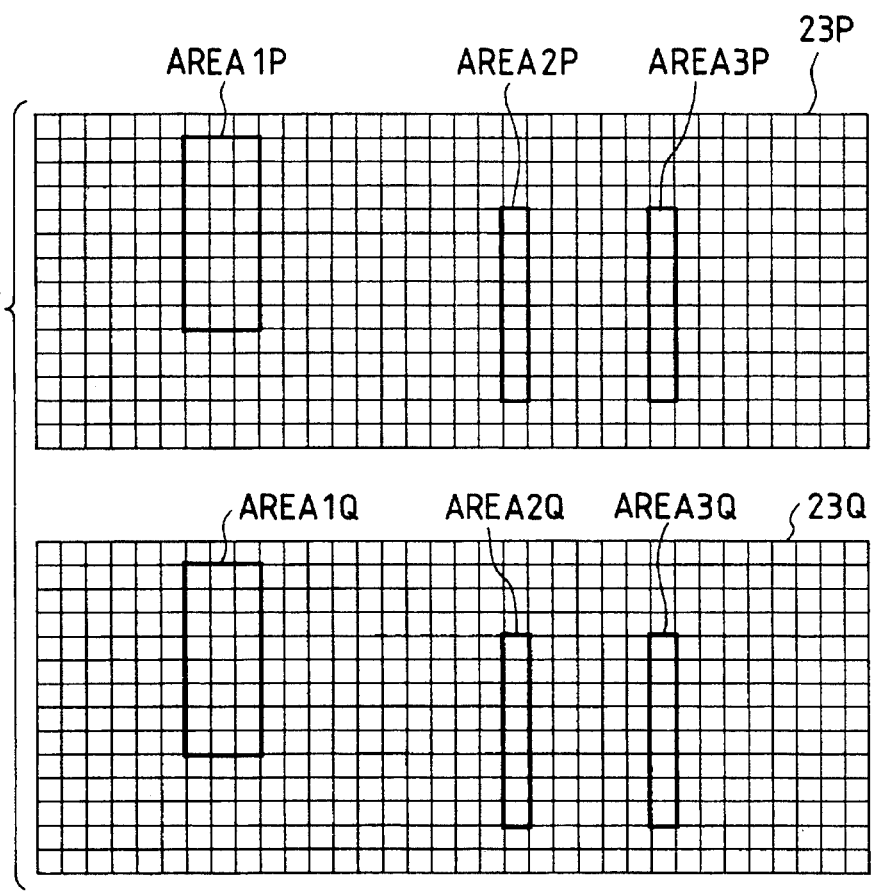
FIG. 3B is an illustration of a focus detection area.

In the arrangement shown in FIG. 3A, the area sensor 23 may be composed of a pair of discrete light receiving regions 23P, 23Q. This construction, however, is only illustrative and the arrangement may be such that the area sensor 23 may have a single continuous light-receiving region, provided that such a single light-receiving region provides the required controllability. In general, however, since two separate images are to be obtained, there is essentially a boundary region which does not participate in the formation of optical images. It is preferred that peripheral circuits are disposed in such a boundary region so that the size of the chip can be decreased.

Focus detection of the phase differential type relies upon correlations between corresponding portions of two optical images. Therefore, each of the focus detection regions designated by the function (1) described above should have a pair of corresponding sensor pixel blocks (AREAs), one in the light-receiving area 23P and the other in 23Q. For instance, a pixel block AREA 1P and a pixel block AREA 1Q have to be designated concurrently at the corresponding positions and in the same configuration in the respective light-receiving regions 23P and 23Q, as will be seen from FIG. 3B. Similarly, pixel blocks AREA 2P and AREA 2Q are to be designated simultaneously in the same configuration and at the same positions in the two light-receiving regions 23P and 23Q, and so are pixel blocks AREA 3P and AREA 3Q. Identity of position and configuration and concurrence are not required between pixels of different focus detection areas, e.g., between AREA 1P and AREA 2P.

The adding function (3) mentioned above also has to be performed equally on the corresponding pixel blocks of both light receiving regions 23P, 23Q. For instance, when values on the three-row pixel array in AREA 1P are added, addition must be conducted simultaneously also for the values on the 3-row pixel array of AREA 1Q.

It is also preferred that the signals for AGC are derived commonly from an area which is disposed between the light receiving regions 23P and 23Q. For instance, a peak signal output from AREA 2P and from the AREA 2Q are input to an OR circuit which selects the greater one of these peak signals, and the control of accumulation of signal charges is controlled in both light-receiving regions in accordance with the selected peak signal. With this arrangement, it is possible to maintain concurrence of charge accumulation control in both pixel blocks AREA 2P and AREA 2Q, whereby any discordance due to variation or difference in the characteristics of circuit elements can be eliminated.

Although three areas are designated in the illustrated embodiment, it will be understood that a plurality of areas of a number other than 3 may be designated and the reliability of the focus detection can be enhanced by increasing the number of the areas designated.

The construction of the area sensor 23 will be described hereinunder. Since the area sensor is composed of a pair of regions 23P, 23Q which have an identical construction, only one of these regions will be described byway of example.

Figure 4:
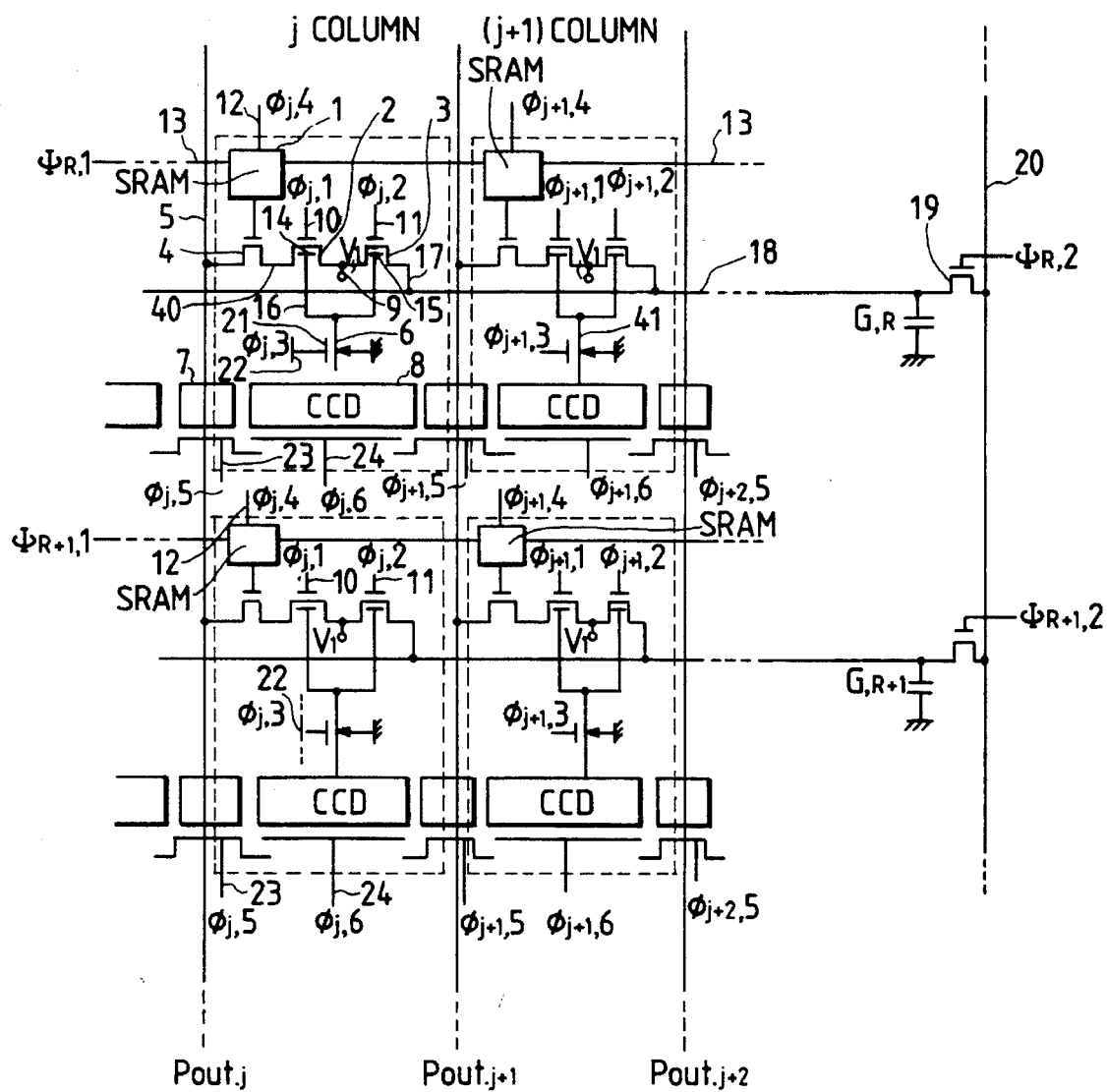
FIG. 4 is an illustration of an area sensor accordance with the present invention.

FIG. 4 is a connection diagram showing the construction of a portion define by lines R and R+1 and columns j and j+1 of one of the area sensor (right) shown in FIG. 3. Each pixel is demarcated by broken lines.

Each pixel, as represented by the pixel on the line R and the column i, has an SRAM 1 which serves as a memory circuit for designating AF areas, amplifiers 2, 3, a switch 4, an output line (Poutj) 5 for outputting the peak value of the light quantity in each vertical row (column) j of pixels in a designated area, a photoelectric conversion photodiode 6, and charge coupled devices 7, 8 for transferring signal charges. The amplifiers 2 and 3 are connected to a powder supply ($V_1$) denoted by 9. Common vertical lines 10, 11 are connected to the gates of the amplifiers 2, 3 so as to supply pulses $\phi_{j,1}$ and $\phi_{j,2}$. The SRAM 1 receives a pulse $\phi_{j,4}$ and $\Psi$ R1 through a vertical line 12 and a horizontal line 13, respectively. A photoelectric converting photodiode 6 is connected through a line 16 to sensing channels 14, 15 beneath the gates of the amplifiers 2, 3.

The source electrode 17 of the amplifier 3 is connected to a horizontal reading line 18 to which is connected a signal reading capacitor $C_{T,R}$ and further to a common vertical reading line 20 through a switch 19. An electrode 21 is provided on the upper surface of the photodiode 6 as the photoelectric converter, through the intermediary of an oxide film. The electrode 21 receives a pulse $\phi_{j,3}$ through a common vertical line 22. Pulses $\phi_{j,5}$ and $\phi_{j,6}$ are applied to the CCDS 7, 8 via common vertical lines 23, 24, respectively.

Figure 5A:
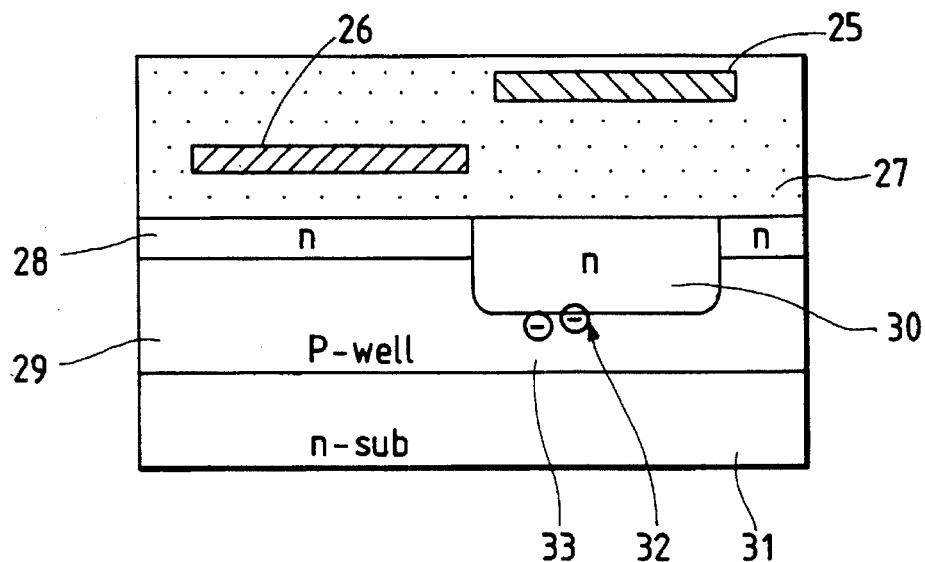
FIGS. 5A and 5B are sectional views of the sensor shown in FIGS. 4.
Figure 5B:
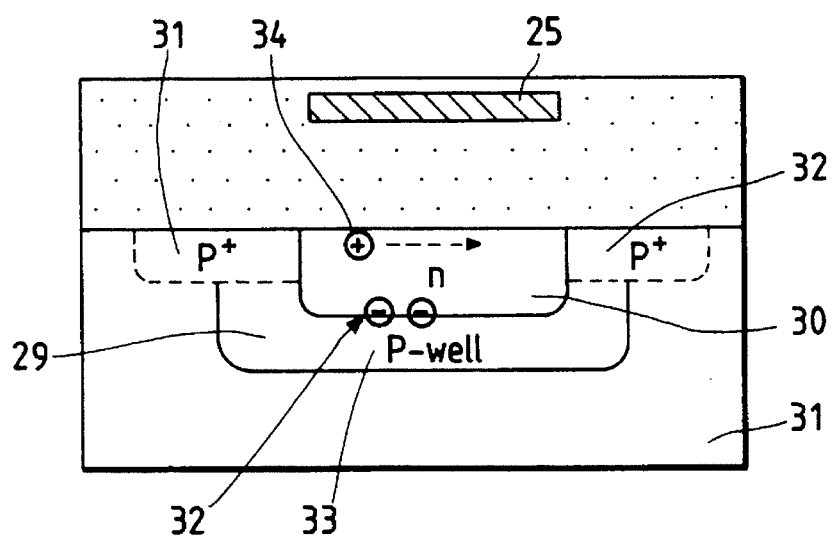

FIG. 5A is a sectional view of the device shown in FIG. 4, showing particularly the portions immediately under the gates of the amplifiers 2, 3, as well as the photoelectric converter, while FIG. 5B is a sectional view of the device showing particularly the source, gate and drain of the amplifiers 2, 3. Numeral 25 denotes the gate electrode of the amplifiers 2, 3. In order to reduce the gate capacitance, an oxide film having a large thickness of about 1000 Å is provided between the gate electrode 25 and underlying channel layers. Numeral 26 denotes the electrode on the photoelectric converter. Carriers accumulated in the photoelectric converter can be transferred to the sensing channels of the amplifiers in accordance with the conditions of bias applied between the electrodes 25 and 26. Numeral 27 denotes an insulating layer, e.g., an $SiO_2$ layer, while 28 designates an n-type diffusion layer for preventing the depletion layer from contacting the interface between Si and $SiO_2$ so as to suppress the generation of dark current. Numeral 29 denotes a P-well layer, while 31 denotes an, n-type substrate. The P-well 29 has been depleted as a result of the application of a reverse bias between the P well 29 and the substrate 31. Numeral 30 designates an n-layer having a greater depth than the n-layer 28. Carriers generated in the photoelectric converter (electrons in this case) are transferred to the interface 32 between the n-layer and the P-well. The carrier (holes in this case) flowing between the drain and the source 31, 32 are modulated by-the transferred carriers (electrons), whereby amplification is achieved.

Operation modes of the sensor device will be described with reference to FIG. 4.

A description will be given first of the function for designating the focus detection areas.

The designation is performed by writing, in the SRAM of each pixel, by means of pulses, $\phi_{j,4}$ and $\Psi$R1, where j and R represents the identification numbers of the column and lines of the area to be selected or designated. The output of the SRAM of each pixel thus designated is connected to the switch 4, so that the output terminal 40 is connected to the peak detection vertical line 5.

The pulses $\phi_{j,1}$, $\phi_{j,2}$, $\phi_{j,3}$, $\phi_{j,5}$, and $\phi_{j,6}$ are applied such that the highest potential is developed at the sensing channel of the amplifier 2. As a result of the development of such a high potential, all the carriers generated in the photoelectric converter are made to flow into the sensing channel 14 of the peak detection amplifier 2. By the carriers moved to the sensing channel, the output of the amplifier is modulated and delivered to the peak detection vertical line according to the principle shown in FIG. 5B. The amplified holes and the electrons generated through photoelectric conversions do not re-join each other because they are in different regions.

A description will now be given of the reading of signals, along a horizontal line, conducted upon completion of the charge accumulation.

The peak value of the signals of pixels disposed in the line direction within the designated area is detected through each peak value output line Poutj during the period of accumulation. Therefore, when the peak output of a vertical line to be detected has reached a predetermined value, and when accumulation is finished with the column j, pulses $\phi_{j,1}$, $\phi_{j,2}$ and $\phi_{j,3}$ are applied so as to develop the highest potential at the sensing channel of the amplifier 3. Consequently, the carriers which have been generated through the photoelectric conversion and which have been accumulated in the sensing channel 14 of the amplifier 2 are transferred to the sensing channel 15 of the amplifier 3, whereby an amplified signal is read through the horizontal reading line 18 into the capacitor $C_{T,R}$.

An output line read-out operation will be explained.

The signal held by each capacitor $C_{T,R}$ is output to the output line 20 through a switch 19 in response to a pulse $\Psi_{R,2}$.

A description will now be given of the operation for adding pixel signals in the horizontal direction. This operation is conducted, for example, when the peak value of the signal available from the vertical line from which the signal is to be detected is still lower than the expected level even after elapse of the maximum accumulation time demanded in the system. In such a case, signal carriers which have been accumulated in the sensing channel of the peak detection amplifier 2 are transferred to the CCDs (CCDs denoted by 8 in case of the column j) connected to each pixel column, after completion of the accumulation operation. In case of the column. j, this can be performed by applying pulses $\phi_{j,1}$, $\phi_{j,3}$ and $\phi_{j,5}$.

Addition of carriers in the horizontal direction is then conducted. For instance, a signal on the column j+1 is added to that of the column j. This can be performed by shifting the carriers from the CCDs of pixels on the column (j+1) to the CCDs denoted by 8 by means of pulses $\phi_{j+1,5}$, $\phi_{j+1,6}$, whereby carriers on the columns j and (j+1) are added together. After the addition, pulses $\phi_{j,2}$, $\phi_{j,3}$ and $\phi_{j,8}$ are applied to develop a high potential at the channel 15 of the reading amplifier 3 so as to shift the carriers, whereby the sum of the signals on the column j and the column (j+1) are output to the horizontal reading line.

A description has been done for the method of the adding signals on the two columns, the column j and the column (j+1). The addition of signals in the horizontal direction, however, maybe executed on a greater number of columns by suitable application of pulses, as will be clear to those skilled in the art.

The above-described addition of signals in the horizontal direction is to conduct the addition when the level of the peak of the signal on a column of interest is found to be still low during the peak detection executed after the completion of accumulation in each column.

The addition, however, may be performed during execution of the accumulation operation in the designated area, as described hereinbelow.

The designation of the two-dimensional focus detection area is conducted in the manner described before. Then, accumulation of signal carriers is conducted as follow and the addition of signals on successive columns, e.g., column j and column (j+1) is conducted during the execution of the accumulation.

Potentials of the respective semiconductor layers, determined by pulses $\phi_{j,1}$, $\phi_{j,2}$, $\phi_{j,3}$, $\phi_{j,5}$, $\phi_{j,6}$, $\phi_{j+1,1}$, $\phi_{j+1,2}$, $\phi_{j+1,3}$, $\phi_{j+1,5}$ and $\phi_{j+1,6}$ are respectively represented by $V\phi_{j,1}$, $V\phi_{j,2}$, $V\phi_{j,3}$, $V\phi_{j,5}$, $V\phi_{j,6}$, $V\phi_{j+1,1}$, $V\phi_{j+1,2}$, $V\phi_{j+1,3}$, $V\phi_{j+1,5}$ and $V\phi_{j+1,6}$.

These pulses are applied to meet the following conditions (1) and (2):

$$V\phi_{j,2}, V\phi_{j,3} < V\phi_{j,1} \qquad (1)$$

$$V\phi_{j+1,1}, V\phi_{j+1,2} < V\phi_{j+1,3} < V\phi_{j+1,6} < V\phi_{j+1,5} < V\phi_{j,6} < V\phi_{j,3} \qquad (2)$$

When these conditions are met, all the carriers generated in the photodiodes in the column j and the column (j+1) are collected in the sensing channels 14 of the amplifiers 2 of the column j, whereby the signals representing the sum of the signals on the horizontally consecutive two pixels are read to the peak output lines.

Upon completion of the accumulation operation, the horizontal line reading operation and output line reading operation are executed so that added signals are obtained in the horizontal lines and the output lines.

Using the described area sensor in combination with an automatic focusing optical system, it is possible to construct a camera having a construction which will be described hereunder by way of example. Although a silver salt type camera is described, it is to be understood that the invention can equally be applied to video cameras, ITV cameras and other industrial purposes.

Figure 6A:
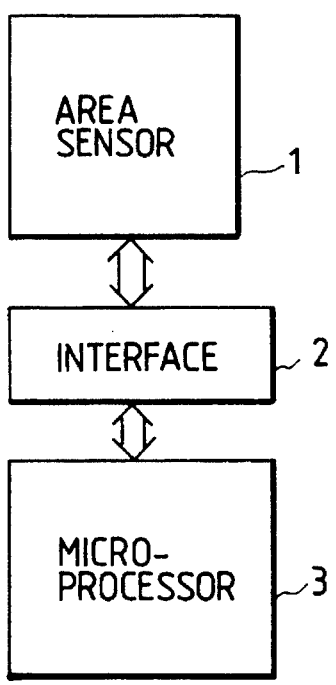
FIG. 6A is a circuit diagram showing an electrical circuit of an embodiment of the focus detection system in accordance with the present invention.

FIG. 6A is a block diagram of an example of a processing system which conducts an automatic focusing processing by using the area sensor described above. The processing system has, in addition to the area sensor 1, a microprocessor 3 and an interface circuit 2 which delivers to the microprocessor 3 the monitor signals (peak value signals) and pixel signals read from the respective columns of the area sensor 1. As will be explained later, the interface circuit includes a comparator which compares the peak signals of the respective columns with a reference value and outputs the results to the microprocessor 3, amplifiers for amplifying the rear pixel signals, and A/D converters for converting amplifier outputs into digital signals which are delivered to the microprocessor 3. The interface circuit supplies various control signals (pulses) to the area sensor for driving and controlling the area sensor in accordance with instructions given by the microprocessor.

Figure 6B:
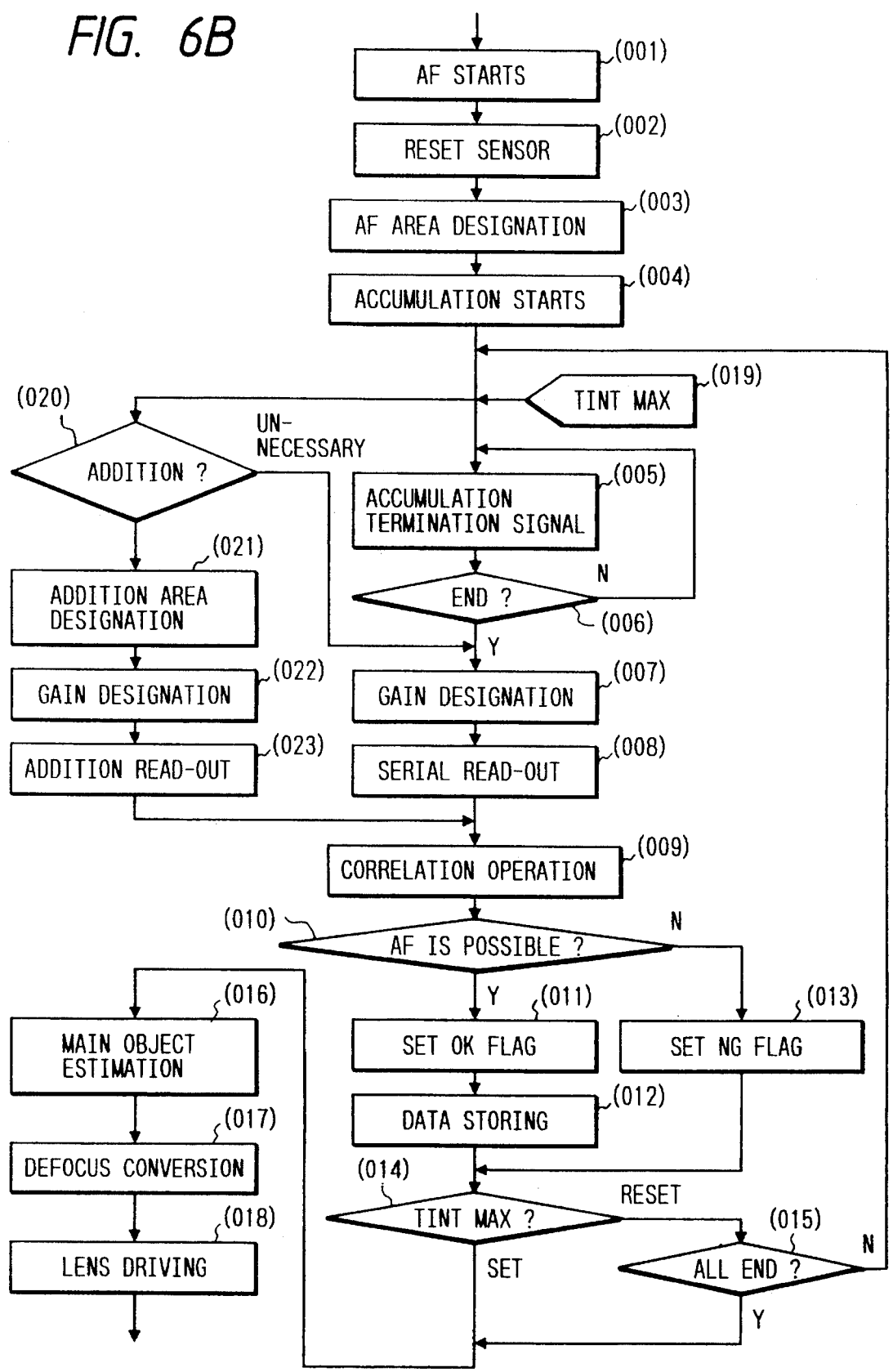
FIG. 6B is an illustration of the control flow performed by the focus detection system shown in FIG. 6A.

FIG. 6B shows a program flow chart stored in a ROM of the microprocessor 3. The operation is executed in accordance with this flow. The operation, therefore, will follow the flowchart shown in FIG. 6B. The control flow of the camera may be stored in the form of a ROM in the microprocessor (see FIG. 6A), as in ordinary automatic focus control cameras.

In step 001, the automatic focusing program is started so that various flags and RAMs are initialized. In Step 002, the sensor is reset and, in Step 003, the automatic focusing areas are designated. As explained before, the designation of the focus detection areas is conducted by writing 1-bit information in the SRAM of the designated pixels in the automatic focusing area sensor. The designation may be conducted manually or automatically in accordance with the photographing conditions. For instance, in order to appoint three focus detection areas (three columns) when the area sensor has pixels arranged in M lines and N columns, the 1-bit information is written in the pixels which are in the following three areas:

$(M_1, N_1)$ to $(M_2, N_1)$ $(M_1, N_2)$ to $(M_2, N_2)$ $(M_1, N_3)$ to $(M_2, N_3)$

Figure 7A:
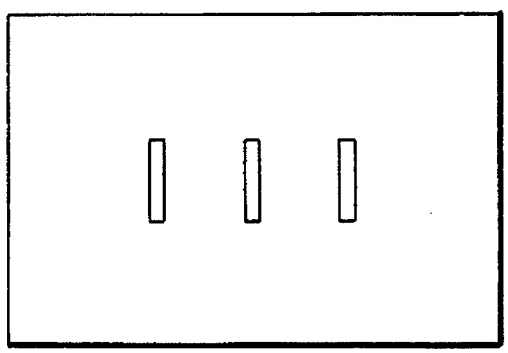
FIGS. 7A and 7B are illustrations of range-finding fields adopted in the focus detection system shown in FIG. 6.
Figure 7B:
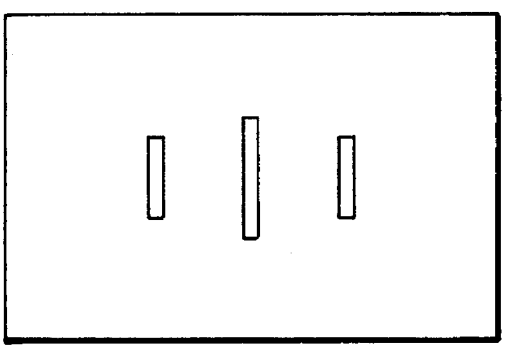

By this method, it is possible to appoint three range-finding areas as shown in FIG. 7A. Obviously, it is not essential that the vertical lengths of all the columns $M_2-M_1$ are equal. For instance, it is possible to appoint the focus detection areas such that the area which is midst has a vertical length greater than those of the left and right areas, as shown in FIG. 7B. In general, the optimum distribution of the desired focus detection areas varies depending on the focal distance of the photographing objective lens. When the subject to be photographed is moving, the focus detection areas are preferably determined on the basis of the movement of the subject in the past since the subject continues to move in the imaging frame. It is also to be understood that the number of the focus detection areas is not limited to three. As explained before in connection with FIG. 3, the setting of each focus detection area is done in each of the two light-receiving regions. After setting of the focus detection areas, accumulation of the charge is commenced in Step 004.

The area sensor device of the present invention always produces the accumulation amount monitor peak signal Pout.j derived from the designated areas. The arrangement maybe such that the peak signals from each of the columns including the columns in the selected areas is input to an accumulation termination comparator the output of which is inverted when the level of accumulation has reached a predetermined level. With this arrangement, it is possible to confirm completion of accumulation in each pixel column by detecting the state of the output of the accumulation termination comparator. Steps 005 and 006, therefore, include a routine which repeatedly scans the outputs of the accumulation termination comparators which independently determine whether the accumulation has been completed in their associated pixel columns. A technique has been known in which a plurality of comparing levels are used for the accumulation termination comparators for selective use according to the amount or level of the accumulation. With this technique, it is possible to determine, in accordance with the selected comparing level, the amplifier gain in the reading operation.

After detection of termination of the accumulation in the designated area (columns), the process proceeds to Step 007 in which the gain of the amplifier in the reading system is set to the level determined by the method described above. Then, in Step 008, serial reading is performed on the columns with which the accumulation has been completed. In the subsequent Step 009, a correlation computation is executed in a manner known per se, so as to determine the phase difference between the two images which have been formed through different optical paths. Then, in Step 010, the reliability or credibility of the results of the correlation computation is evaluated in a known manner. If the computation results are credible, the process proceeds to Step 011 in which an OK flag indicative of successful automatic focus detection is set on the automatic focus detection area. The results of the computation are then stored in Step 012. Conversely, when the results of the computation are determined to be not credible in Step 010, an NG flag indicative of the focus detection failure is set. Anyway, the process proceeds to Step 014 in which the state of a maximum accumulation time flag indicative of elapse of the maximum accumulation time is determined. If this flag has been set, the microcomputer determines that the accumulation computing sequence has been completed and proceeds the process to Steps 016 onwards, whereas, if this flag has been reset, the process proceeds to Step 015 which determines whether the accumulation computation has been finished on all designated areas (columns). If the accumulation computation has been finished on all the designated areas, the process proceeds to Step 016, whereas, if not, the process returns to Step 005 to execute the accumulation computation on the areas with which the computation has not been completed. The counting of the accumulation time has been commenced when the accumulation is started in Step 004.

When the process proceeds to Step 016, whether or not the automatic focus detection is possible has been determined for each of the designated automatic focus detection areas (designated columns). When the focus detection has been conducted successfully, information concerning the phase differential between the two images also has been obtained for each of the designated areas when Step 016 is commenced. In Step 016, the main photographing subject in which the photographer is interested is predicted on the basis of the information which has been made available before this Step is started. Various methods have been available for the prediction of the main photographing subject. For instance, the subject which is closest to the camera among the subjects which are in the automatic focus detection areas with which the focus or distance could be found is determined as the main photographing subject. Then, focusing operation is conducted to focus the photographing lens to the main photographing subject which is determined in Step 016. The focusing of the photographing lens on the predicted main subject can be conducted in various manners. For instance, if the lens driving system is of the type which drives the lens on the basis of the amount of defocus, a conversion from the 2-image phase differential information into a defocus amount is executed in Step 017 and, in Step 018, the lens is driven to cancel the defocus.

When the luminance of the subject is too low to enable accumulation to the preset comparing level within the maximum accumulation time, the accumulation is forcibly terminated by an interruption which is executed in Step 019. The maximum accumulation time may be varied in accordance with the photographing mode or the state of operation of the camera. To this end, the interruption is executed in a programmable manner. When this forcible termination of accumulation is executed, the amount of charge accumulated in a single column of pixels is so small that the accuracy of the automatic focus detection may be impaired. In this case, therefore, whether or not the signal available on the next pixel column is to be added is determined in Step 020. In general, any photographing subject has luminance distribution not only in the direction of pixel columns but also in the line direction which is perpendicular to the column direction. The addition of the signals from the adjacent pixel column, therefore, may average the luminance levels so as to cancel the characteristic of the subject pattern. However, considering that the signals indicative of the subject pattern are not distinguishable from electrical noises when the luminance of the subject is low, the above-mentioned averaging is acceptable because it anyway enables increases the level of the pattern signal to enable automatic focus detection.

If the addition of the signals from the adjacent pixel columns is determined as being unnecessary in the Step 020, the process returns to Step 007 to re-start the ordinary sequence. Conversely, when the addition of the signals from the adjacent pixels is preferred, the process proceeds to Step 021 which determines the range or the number of the pixel columns which are to participate in the focus detection, and then to Step 022 which designates a gain of a read-out amplifier. Then, in Step 023, an operation is conducted to add the signals from the adjacent pixel columns and the results of the addition are read. The process then proceeds to Step 009 in which the correlation computation is conducted on the basis of the signals obtained by the addition as described above. After this computation, Steps are followed in the same sequence as the ordinary process described before.

In the described embodiment, Steps 020 to 023 for adding the signals from adjacent pixel columns are executed when the subject is determined to be too dark, through comparison of the accumulated amount monitor peak level with a predetermined level for each pixel column. Namely, this routine is used in the described embodiment as a measure for enabling automatic focus detection when the subject to be photographed is dark.

This, however, is not exclusive and the above-described routine for executing the addition of signals from adjacent pixel columns and the reading of the added signals may be used positively and intentionally for other purposes. For instance, this routine may be intentionally used for automatic focus detection under the assistance of an AF assisting light in a single-lens reflex camera. AF assisting light is projected in a striped pattern in most cameras having the assist-lighting function. Therefore, addition of signals in the direction perpendicular to the stripe does not cause substantial mixing and averaging of the pattern signal levels. It is therefore possible to enjoy the merits of the addition of the signals without being accompanied by the mixing and averaging of the pattern signal levels. Therefore, the above-mentioned routine may be incorporated as a part of the standard routine which is executed whenever the AF assisting light is used. The mixing and averaging of the pattern signal levels do not occur when the subject pattern is a linear pattern which does not have any extension in the direction perpendicular to the sensor pixel columns, while the merit produced by the addition of signals is enjoyed. Therefore, when the subject pattern is a linear pattern, it is possible to positively use the signal adding routes so as to shorten the accumulation time. When the sensor has a function to enable a non-destructive reading function, the automatic focusing control may be conducted such that the accumulated charge amount is read while the accumulation is being continued, and whether the execution of the adding routine is preferred or not is determined on the basis of the read amount. When the sensor does not have the non-destructive function, the control operation may be such that amounts of charges accumulated in the adjacent pixel columns are read in a short time and are analyzed by software to provide a criterion as to whether the accumulation on the adjacent pixel columns will be advantageous. If it is determined that the addition of signals from the adjacent pixel columns will be advantageous, the accumulation of charges is continued on these adjacent columns.

Figure 8:
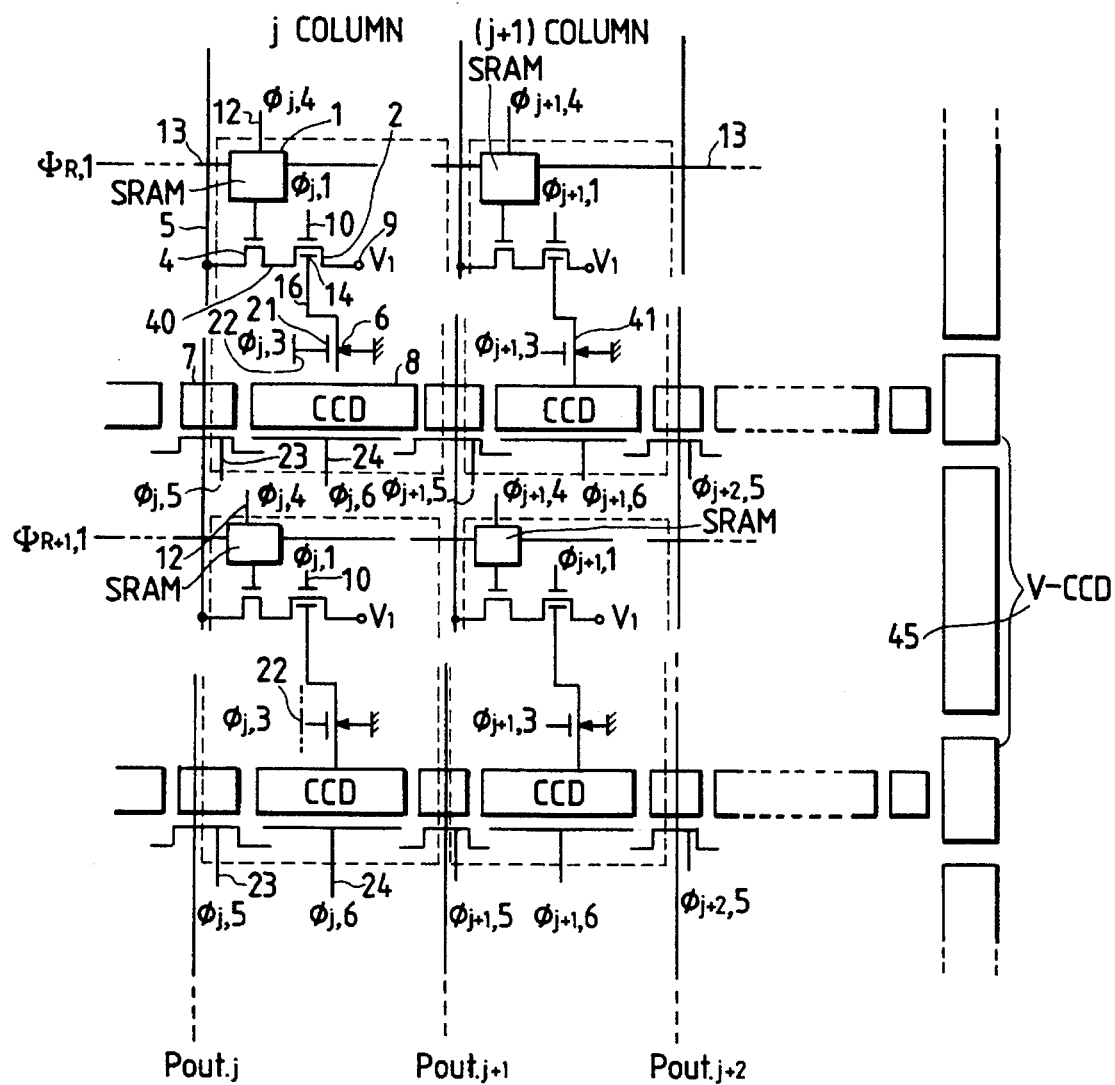
FIG. 8 is an illustration of another embodiment of the area sensor device in accordance with the present invention.
Figure 9:
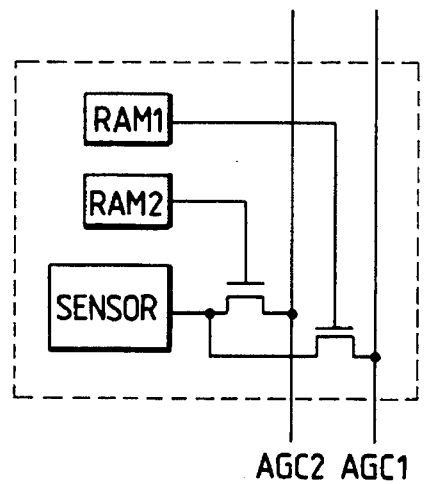
FIG. 9 is an illustration of a modification of the area sensor device shown in FIG. 8.

A description will now be given of the construction of a second embodiment of the sensor device in accordance with the present invention with specific reference to FIG. 8. In FIG. 8, the same reference numerals are used to denote the components which are used in the first embodiment shown in FIG. 4. This second embodiment is characterized in that the CCDs used for the addition of the signals in the first embodiment, is utilized as the reading line and that the output vertical line also is constituted by CCDs as denoted by 45.

Designation of the focus detection areas and the charge accumulation are conducted in the same manner as those in the first embodiment so that detailed description is omitted with these operations. After the completion of the charge accumulation, pulses $\phi_{j,1}$, $\phi_{j,3}$ and $\phi_{j,6}$ are applied to the respective semiconductor layer so as to develop, on these semiconductor layers, potentials $V\phi_{j,1}$, $V\phi_{j,3}$ and $V\phi_{j,6}$ which meet the following condition.

$$V\phi_{j,1} < V\phi_{j,3} < V\phi_{j,6} \tag{3}$$

Consequently, carriers which have been accumulated the sensing channel 14 are shifted to the CCD 8. The charges are then shifted to the vertical CCD 45 through the horizontal array of the CCDs and are then shifted and read through the series of vertical CCDs 45.

Obviously, this second embodiment enables the addition of pixel signals which are adjacent to each other in the horizontal direction.

In the second embodiment, when it is desired to designate two or more different area in a single column, two or more AGC output lines are used in each pixel column, as well as corresponding number of RAMs such as $RAM_1$, $RAM_2$ for making and breaking connections to the respective AGC output lines.

A different type of sensor device, as a third embodiment, will be described hereinunder. The third embodiment of the sensor also meets the following three basic requirements Which are met in the preceding embodiments: (1) Ability to enable the designation of a plurality of focus detection areas at desired positions in the imaging frame. (2) Ability to detect peak values of the light quantity in the respective designated areas. (3) Ability to add light quantities in the direction perpendicular to the direction of arrangement of the pixels for the peak value detection.

The third embodiment, however, employs basic construction, reading method and method of addition/ reading which are different from those in the preceding embodiments.

Figure 10:
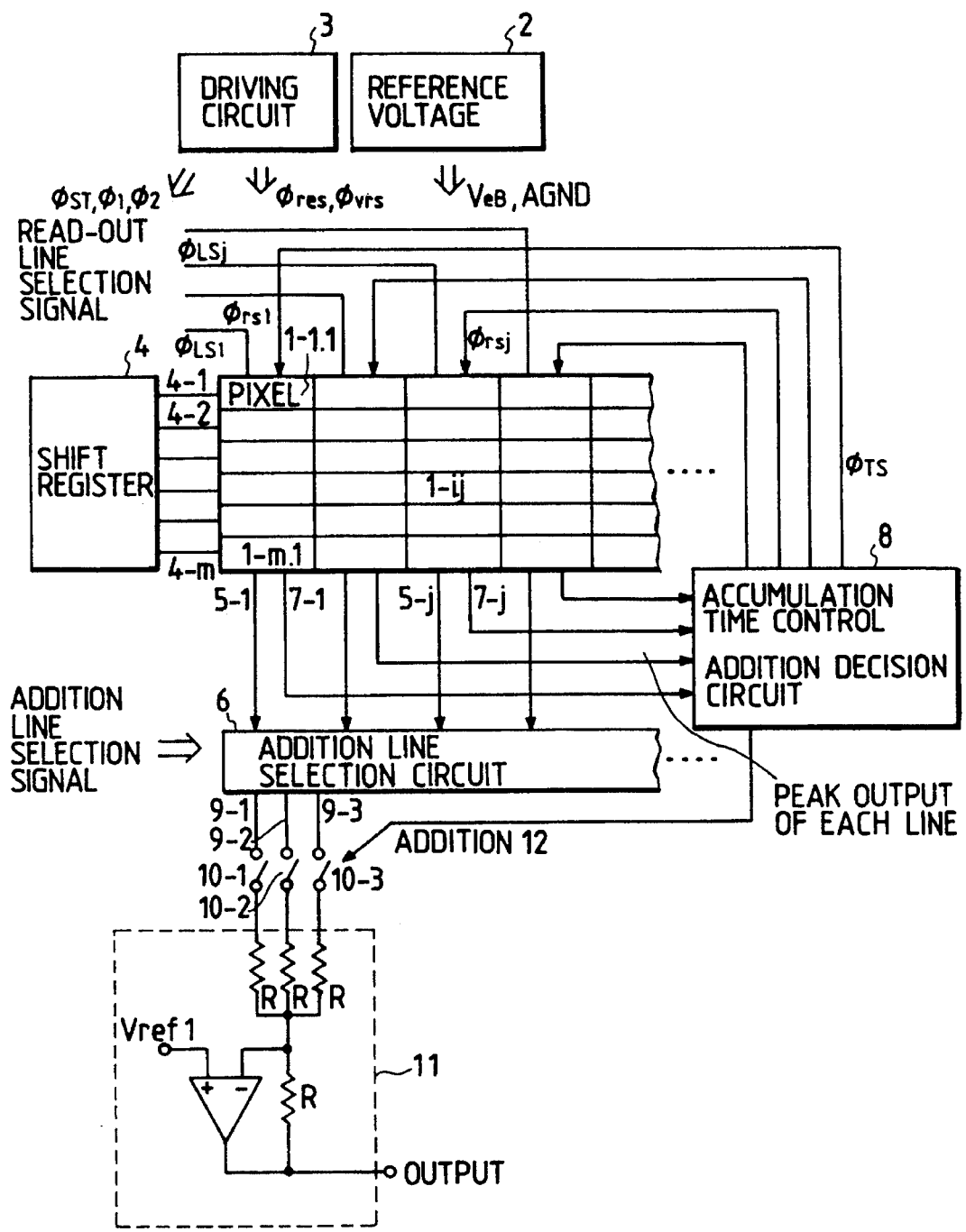
FIG. 10 is an illustration of still another embodiment of the area sensor device in accordance with the present invention.

FIG. 10 shows the construction of the whole structure of the third embodiment. The sensor device of the third embodiment has a reference voltage generating circuit 2 which supplies reset potentials to the pixels $1_{-1,1}$ to $1_{-m,n}$ which are arranged in the form of a matrix having m lines and n columns. The sensor device also has a drive circuit 3 which supplies drive pulses to these pixels.

Numeral 4 designates a shift register which has outputs $4_{-1}$ to $4_{-m}$ which are connected to all the pixels of the corresponding lines. The outputs $5_1$ to $5_{-n}$ of the respective pixel columns are connected to an addition column selection circuit 6. Peak outputs $7_{-1}$ to $7_{-n}$ for the respective columns are connected to an accumulation time control/addition decision circuit 8. The outputs $9_{-1}$ to $9_{-3}$ of the columns selected by the addition column selection circuit 6 are connected to an addition circuit 11 through respective switches $10_{-1}$ to $10_{-3}$. The described connection is intended for adding accumulated charge signals on a designated column and two adjacent columns. The number of the adjacent lines which are to be used in the computation, however, is not limited to 2. The switches $10_{-1}$ and $10_{-3}$ are adapted to be turned on in accordance with an addition execution signal 12 which is delivered when the addition is to be conducted. The switch $10_{-2}$ is a normally-closed switch which is used to pair with the switches $10_{-1}$ and $10_{-3}$.

Figure 11:
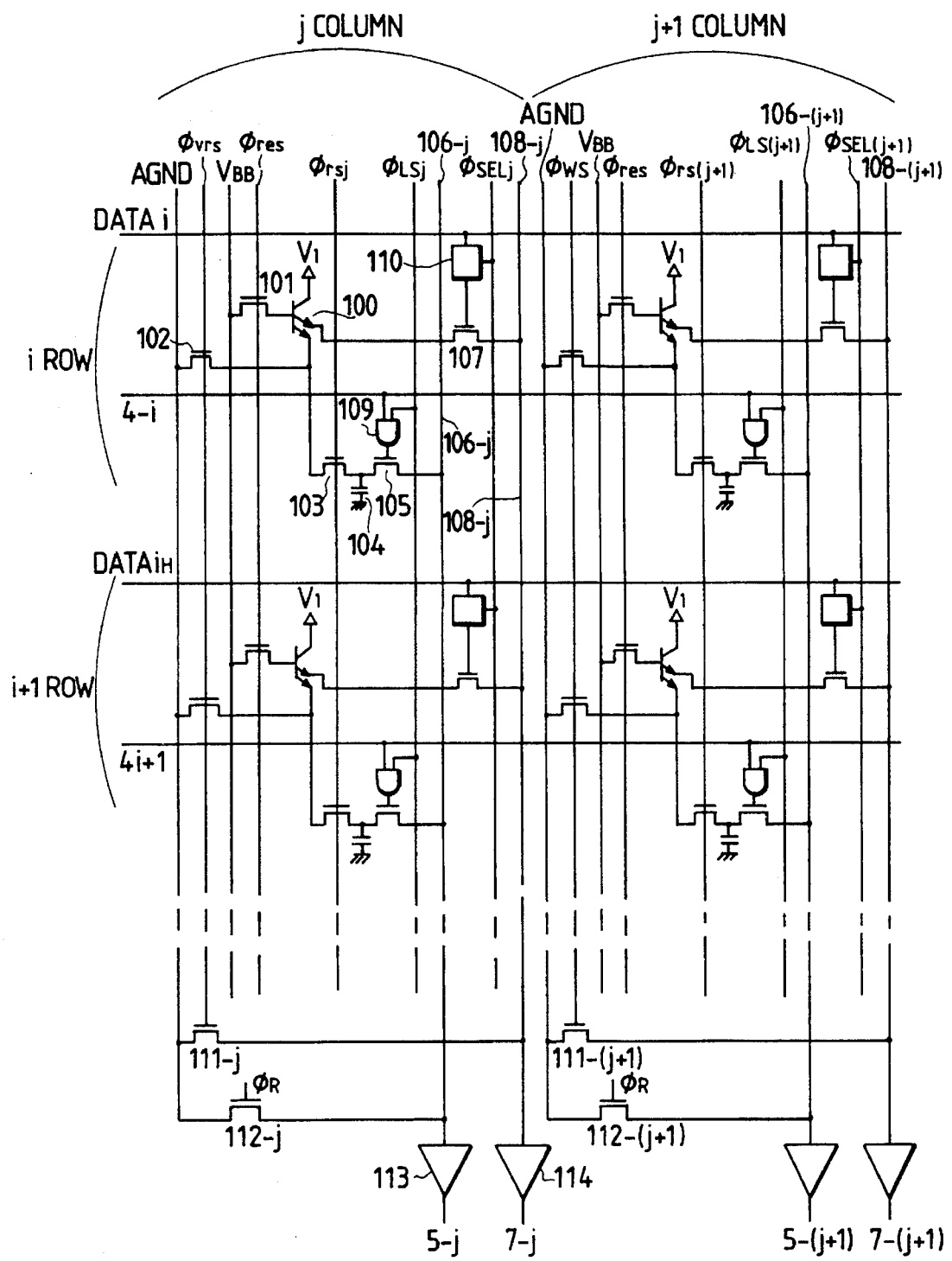
FIG. 11 is an illustration of the detail of the area sensor device shown in FIG. 10.

FIG. 11 shows the construction of a part (i to i+1) of the sensor device shown in FIG. 10. A description will be given of the pixel which is on the line i and the column j. Numeral 100 denotes a phototransistor of the double-emitter type. The phototransistor 100 has a collector connected to a power supply $V_1$. The base of this transistor is connected to the reference voltage $V_{BB}$ through a MOS 101. One of the emitters is connected to the reference voltage AGND through a reset MOS 102 and to an accumulating capacitor 104 through a transfer MOS 103. The same emitter is further connected to the reading line $106_{-j}$ of the column j through a reading MOS 105. The other emitter is connected to the peak line of the column j through an area selection MOS 107.

The reset MOSes 101, 102 have gates which receive, respective y, a base reset pulse $\phi_{res}$ and an emitter reset pulse $\phi_{vrs}$. A transfer pulse $\phi_{Rsj}$ is supplied to the gate of the transfer MOS 103. Numeral 109 designates an AND circuit which produces AND of the reading line selection pulse $\phi_{LSj}$ and the output $\phi_{SRi}(4-1)$ of the shift register. The output of this AND circuit 109 is connected to the gate of the reading MOS 105. A memory circuit 110 is composed of an SRAM in this embodiment although it can be composed of a shift register. A column selection pulse $\phi_{SELj}$ and a data line $DATA_i$ are connected to the memory circuit 110. The output of the memory circuit 110 is connected to the gate of the area selection MOS 107. The peak line 108$_{-j}$ of the column j is connected to ND I through a peak line reset MOS 111$_{-j}$, while the reading line 106$_{-j}$ of the column j is connected to AGND through the reset MOS 112$_{-j}$. Reset pulses $\phi_{vrs}$ and $\phi_R$ are respectively supplied to the gates of the MOSes 111$_{-j}$, 112$_{-j}$. Numerals 113 and 114 respectively denote buffers for outputting, with low levels of impedance, the sensor output and the peak output, respectively.

Figure 12:
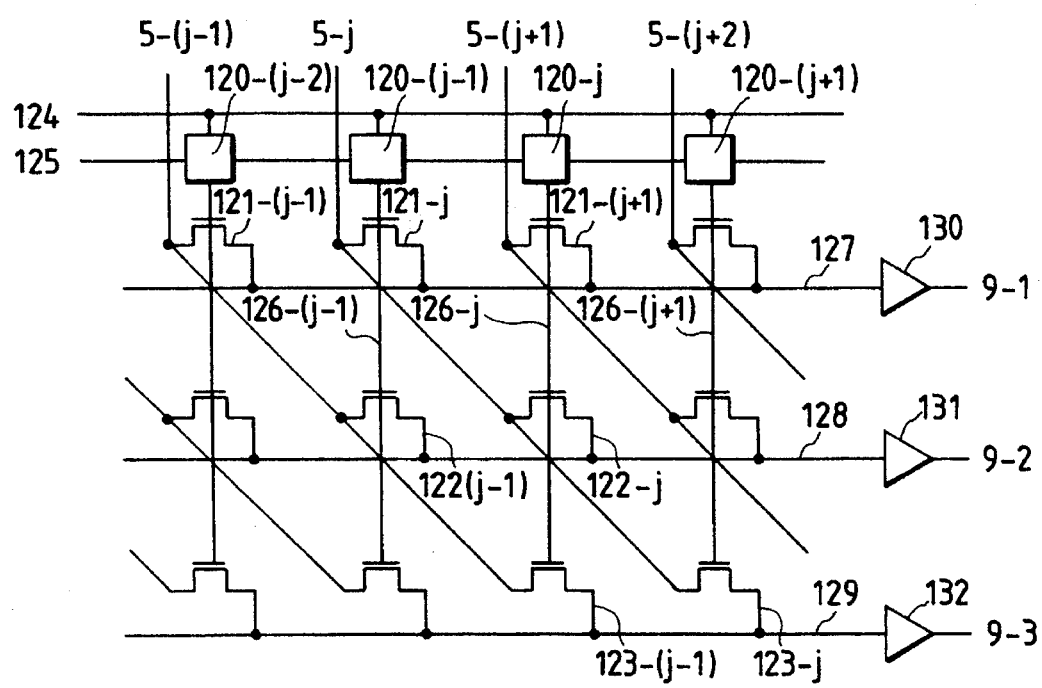
FIG. 12 is a circuit diagram of an example of an addition line selection circuit incorporated in the area sensor shown in FIG. 10.

A detailed description will be given of the addition column selection circuit with specific reference to FIG. 12. Memory circuits 120$_{-1}$ to 120$_{-n}$ for designating codes carrying the signals to be added are composed of, for example, shift registers and are connected to a drive pulse line 124 and a data line 125. Referring specifically to the column j, the sensor outputs 5$_{-j}$ of the column j is connected to lines 127, 128 and 129 through switch MOSes 121$_{-j}$, 122$_{-j}$ and 123$_{-j}$. On the other hand, the gates of the MOSes 121$_{-j}$ to 123$_{-j}$ are connected to the outputs 126$_{-(j-1)}$, 126$_{-j}$ and 126$_{-(j+1)}$ of the memory circuits 120$_{-(j-1)}$, 120$_{-j}$ and 120$_{-(j+1)}$. Output buffers 130 to 132 are provided between the lines 127 to 129 and the outputs 9$_{-1}$ to 9$_{-3}$, respectively.

A description will now be given of the operation of the third embodiment.

The operation for designating focus detection areas is as follows.

Pulses $\phi_{SEL}$ and DATA$_i$ are supplied to the memory circuits 110 in FIG. 11, corresponding to the pixels in the area to be designated. As a consequence, a potential for turning the switch 107 on is stored only in the pixels within the areas to be designated. In this designating operation, the emitters of the pixels of the designated columns are connected to the peak line 108$_{-(j+n)}$ so that the maximum value of the pixel outputs of the designated column is delivered to the line 7$_{-(j+1)}$.

The accumulating operation is as follows.

Figure 13:
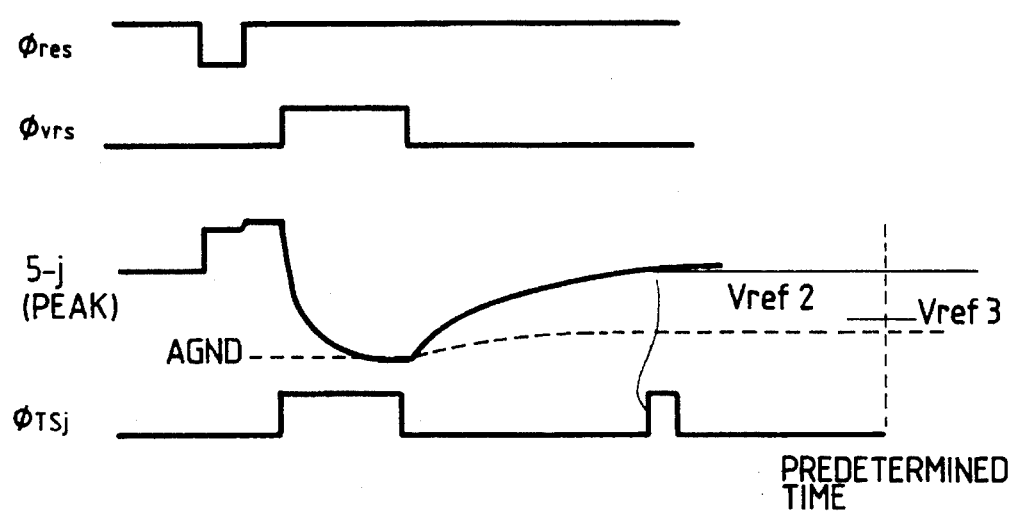
FIG. 13 is a waveform chart illustrative of the operation of the area sensor device shown in FIG. 10.

The sensor reset to commence the charge accumulation when the pulses $\phi_{res}$ and $\phi_{vrs}$ as shown in FIG. 13 are applied. At the same time, the maximum values of the pixel outputs of each designated column is delivered to the peak line of the column. The capacitor 104 is reset when the pulse $\phi_{TSj}$ is turned on while the pulse $\phi_{vrs}$ has been on.

The termination of the accumulation operation is as follows.

It is assumed here that the peak output 7$_{-j}$ of the column j has reached a predetermined potential $V_{ref2}$. The peak output is input to the accumulation time control/addition determination circuit 8 and is compared with the reference potential $V_{ref2}$. When the peak output has reached the level of the potential $V_{ref2}$, the pulse $\phi_{TSj}$ is turned on and, simultaneously, the sensor pixel outputs of the column j are read in capacitors which correspond to the memories 104. In this case, addition of signals of adjacent columns is not conducted because the microcomputer determines that signal components of sufficiently high levels have been obtained with a predetermined time.

When the level of the peak output 7$_{-j}$ has not reached the reference level $V_{rev}$ within the predetermined time, the pulse $\phi_{TSj}$ is forcibly turned on so as to terminate the accumulation.

In this case, when the level of the peak output 7$_{-j}$ is below the second potential $V_{ref3}$ ($V_{ref3} < V_{ref2}$), it is determined that the signal level will never be saturated, even when the signals of the adjacent columns are added, so that the addition should be executed.

Alternatively, the decision as to whether the addition is to be executed may be conducted by calculating, at the time of the forcible termination, the sum of the peal values of the peak outputs 7$_{-j}$, 7$_{-(j-1)}$, 7$_{-(j-1)}$ and determining whether the sum will exceed the saturation level.

The accumulation termination and the decision as to whether the addition is to be executed are conducted on each of the designated columns.

A description will now be given of the addition/reading operation. The operation on the column will be described by way of example. To execute the addition/reading operation on the column j, a pulse $\phi_{LSj}$ is supplied to designate the reading line 106$_{-j}$. At the same time, the addition line selection circuit 120$_{-j}$ shown in FIG. 12 is selected through the pulse line 124 and the data line 125.

Subsequently, the outputs 4$_{-i}$ (i=1 to m) are successively turned on by the shift register 4, so that the charges accumulated in the capacitors (correspond to memories 104) are capacitance-divided and output to the output 5$_{-j}$ through the reading line 106$_{-j}$. The charges output from the output 5$_{-j}$ is delivered to the output 9$_{-2}$ through the switch 122$_{-j}$. In this state, the switch 10$_{-1}$ and 10$_{-3}$ are kept off because the adding operation is not to be conducted, so that the signal charges form the output 9$_{-2}$ is directly output with reference to the reference potential $V_{ref1}$. Obviously, a similar reading operation is executed on other designated columns than the column j.

When the adding operation is to be conducted, the operation is as follows. In this case, the column selection pulses for designating the columns to be added are designated, simultaneously with the designation of the addition column selection memory circuit of the central column. It is assumed here that the addition is to be conducted of the signals from the column j$_{-1}$, j and j$_{+1}$. In this case, selection pulses $\phi_{LS(j-1)}$ to $\phi_{LS(j+1)}$ are used, and the memory circuit 120$_{-j}$ is selected. The outputs 4$_{-i}$ (i=1 to m) are successively turned on by the shift register 4, so that the outputs of the columns j$_{-1}$, j and j$_{+1}$ are output to the output lines 5$_{-(j-1)}$, 5$_{-j}$ and 5$_{-(j+1)}$. In this case, since the switch MOSes 121$_{-(j+1)}$, 122$_{-j}$ and 123$_{-(j-1)}$ have been turned on, the outputs from the output lines 5$_{-(j+1)}$, 5$_{-j}$, 5$_{-(j-1)}$ appear on the lines 127, 128 and 129, respectively, and are added to the outputs 9$_{-1}$ to 9$_{-3}$ through the buffers 130 to 132. Switches 10$_{-1}$ and 10$_{-3}$ also have been turned on to enable the addition, so that the sum of the outputs 9$_{-1}$ to 9$_{-3}$ is delivered to the output 13 with reference to the reference voltage $V_{ref1}$.

Figure 14:
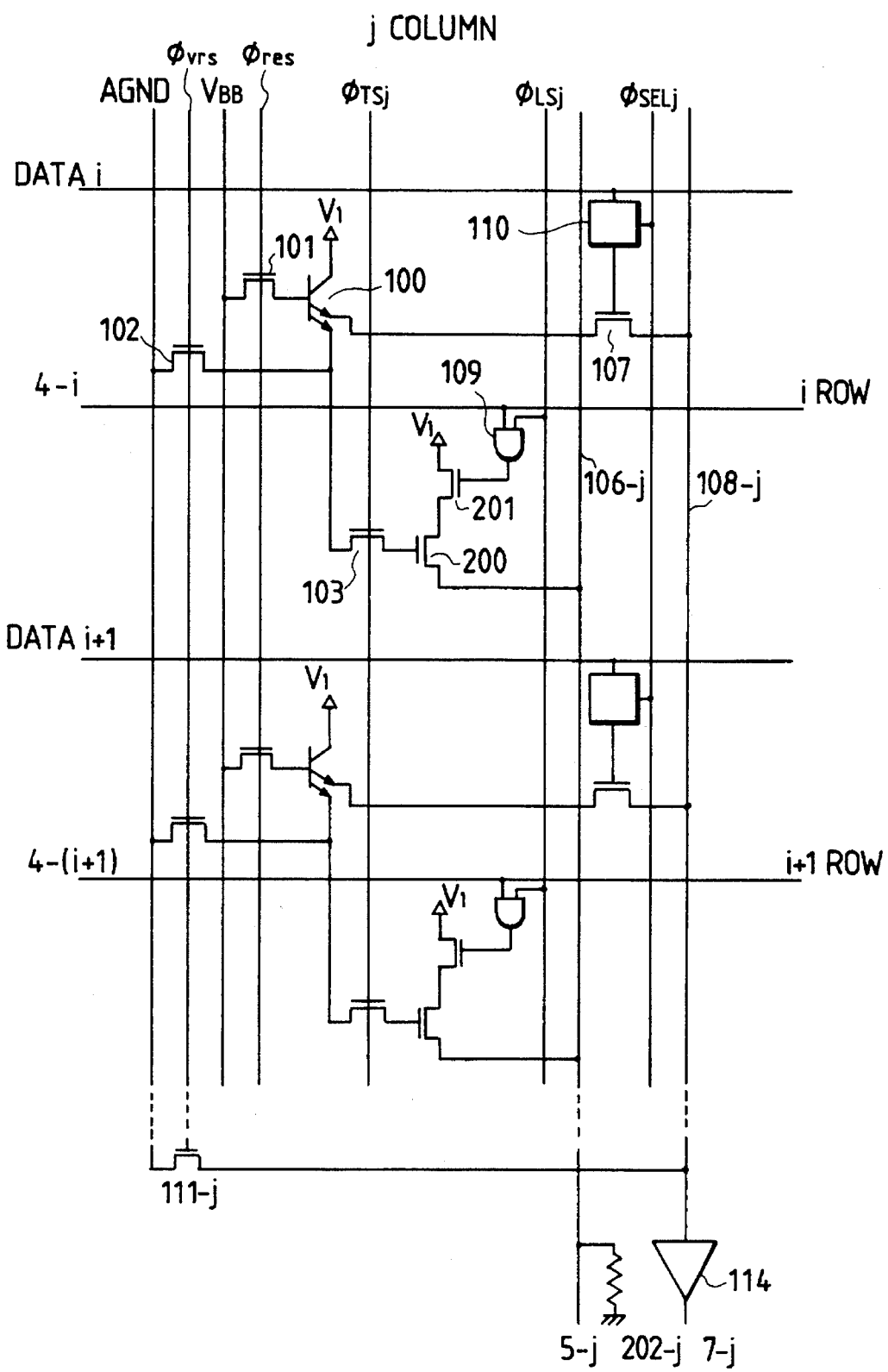
FIG. 14 is an illustration of a critical portion of a different embodiment of the area sensor device in accordance with the present invention.

FIG. 14 shows a modification of the third embodiment in which the pixel arrangement is partially changed from that in the third embodiment. In FIG. 14, the same reference numerals are used to denote the same components as those in the third embodiment. The pixel arrangement is shown only for the column j, since other columns are constructed exactly in the same manner as the column j. In this modification, one of the emitters of the double-emitter photodiode is connected to the gate of the MOS 200 through the transfer MOS 103. The drain of the reading MOS 200 is connected to the power supply $V_1$ via the reading pixel selection MOS 201, while the source is connected to the reading line 106$_{-j}$ of the column j. The output of the AND circuit 109 is connected to the gate of the reading pixel selection MOS 201. The reading lines 106$_{-j}$ etc of the respective columns are grounded through the loads 202$_{-j}$. The reading MOS 200 and the load 202$_{-j}$ cooperate with each other in forming a source follower circuit. The operations of the sensor device shown in FIG. 14 are as follows.

The area designation operation and charge accumulation operation are not described because they are identical to those in the third embodiment.

A description will now be given of the operation for terminating the charge accumulation. It is assumed here that the accumulation has been finished on the column j so that the pulse $\phi_{TSj}$ is turned on as in the third embodiment. The instant potential of the emitter of the sensor is read into the gate of the reading MOS 200 through the transfer MOS 103. Subsequently, the pulse $\phi_{TSj}$ is turned off so that the emitter potential is held as the charges are charged in the gate capacitor of the transfer MOS 103.

The reading operation will now be described.

The column to be read is designated by the pulse $\phi_{LS}$. It is assumed that the column j is to be read. In this case, the column j is designated by the pulse $\phi_{LSj}$ and the shift register 4 is actuated. Consequently, the AND circuits 109 of the designated pixels produce "H" signals to turn the MOS 201 on, whereby the voltages of the pixels finally built up by accumulation in the pixels are delivered to the read lines $5_{-j}$ by the source follower arrangement.

Reading from the columns other than the column j is conducted in the same manner.

The adding operation is the same as that performed in the third embodiment.

Designation of focus detection areas realized in the embodiments described hereinbefore offer various advantages among which shortening of the reading time is most remarkable. In most of photographing equipments such as cameras, a 1-chip microcomputer (IC) is used as the central processing unit, and reading of image signals is conducted under a programmed control using AD converters, RAMs and so forth which are incorporated in the IC. Such an IC can be produced at a comparatively low cost and has a high degree of freedom of the system design, but suffers from a disadvantage in that the processing speed is impractically low. Storing a large quantity of pixel information and using such abundant information only selectively, therefore, is not preferred from the view point of the processing time and the memory effectively. In other words, it is preferred that only the data of interest are produced by the sensor.

Figure 15A:
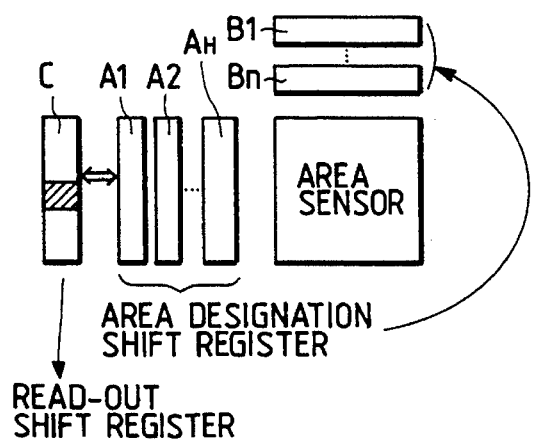
FIGS. 15A and 15B are illustrations of a different embodiment of the area sensor device in accordance with the present invention.
Figure 15B:
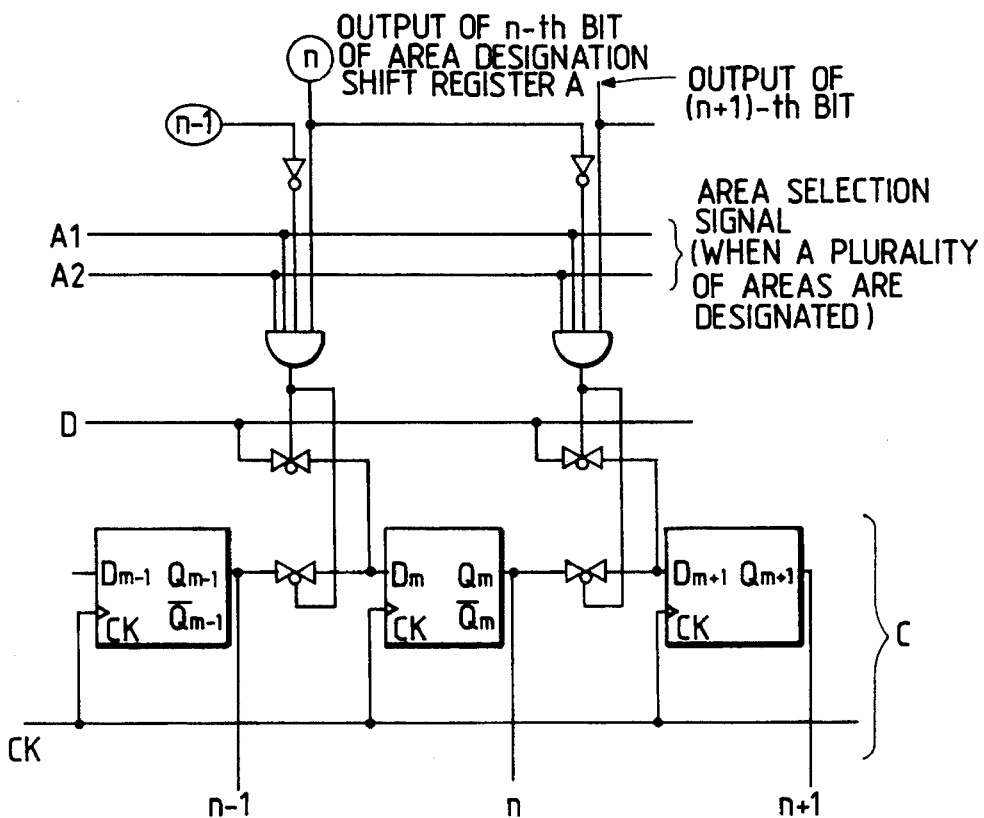

FIG. 15A shows an improved sensor device which adopts a pixel access method similar to that in the embodiment shown in FIGS. 10 and 11. This improved sensor device has a plurality of vertical shift registers $A_1$ to $A_n$ and a plurality of horizontal shift registers $B_1$ to $B_n$, so as to make it possible to simultaneously designate a plurality of regions to be read. FIG. 15B illustrates the connection between the area read-out shift register C which also is shown in FIG. 15A and designation shift registers A. The reading operation in this improved sensor will be described briefly. When the designation is commenced from n-th bit in the area designation shift register A1, the output from the n-th bit of the area designation shift register A is "H", whereas the output (n-1) from the (n-1)th bit is "L". Therefore, the AND of the four inputs is "H" only for the n-th bit. Therefore, the data D is input to the flip-flop Dm of the read-out shift register, so that the operation of the read-out shift register C is commenced from its H-th bit, i.e., the n-th bit of the flip-flop Dm. It is possible to commence the access to the area sensor with the reading of the pixel output of the n-th bit in the designated column of the area sensor.

Figure 16:
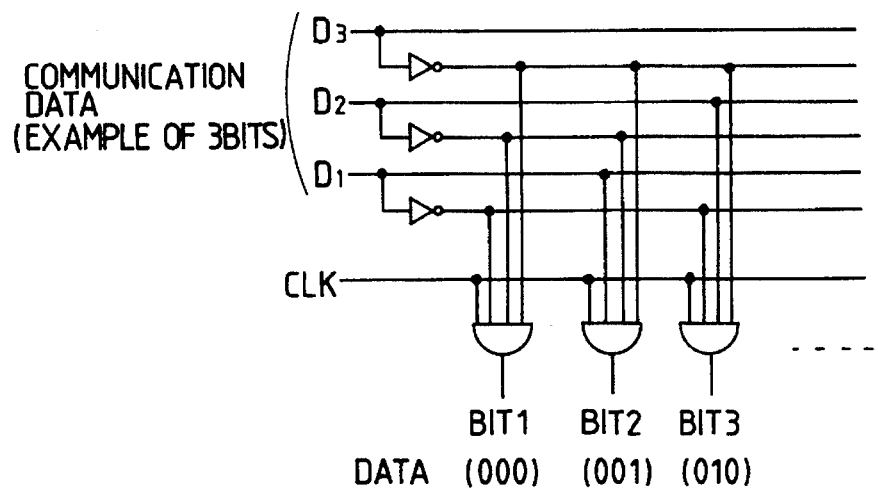
FIG. 16 is a circuit diagram showing an example of a reading circuit associated with an area sensor in accordance with the present invention.

It is also possible to use a decoder which reads the designated area in a bit-by-bit manner. For instance, it is possible to use a decoder as shown in FIG. 16. In this case, area designation data are input to the data lines $D_1$ to $D_3$.

Figure 17:
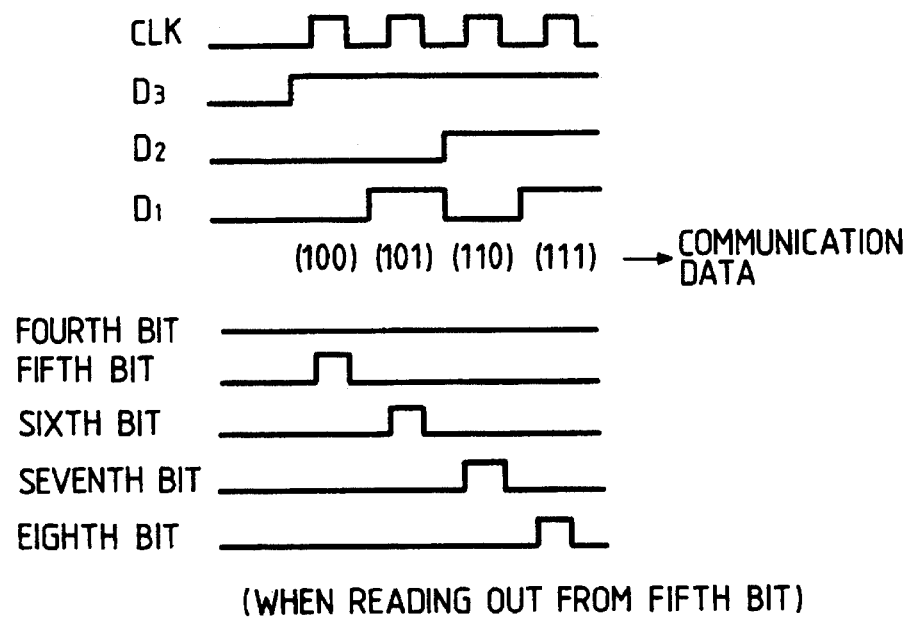
FIG. 17 is an illustration of operation of the reading circuit shown in FIG. 16.

In response to the supply of the area designation data, reading pulses synchronous with the clocks CLK are output from the AND gates designated by the data $D_1$ to $D_3$. For instance, when data as shown in FIG. 17 are input to the data lines $D_1$ to $D_3$, the AND gate which constitutes the output of the decoder commences outputting of the reading data from the gate of the fifth bit. Consequently, the reading of the pixel output is started from the fifth pixel when the pixel outputs are accessed by the output of this decoder.

As will be understood from the foregoing description, the photoelectric sensor device of the present invention enables designation of a plurality of areas in terms of pixel blocks in any desired size and at any desired position in the area sensor. This sensor device, therefore, provides various advantages such as ease of design and construction of automatic focusing system with a plurality of range-finding spots or areas.

What is claimed is:

1. An image pickup apparatus comprising:

a two-dimensional image sensor for converting an optical image into an electrical signal;

optical means for impinging at least two different optical images on said image sensor;

designating means for variable designating areas within said two-dimensional image sensor, each of said areas receiving one of the at least two different optical images, respectively; and processing means for processing said electrical signal from said two-dimensional image sensor.

2. A device according to claim 1, wherein said at least two optical images are images at different positions of the same object.

3. A device according to claim 2, wherein said different positions are parallel to each other.

4. A device according to claim 1, wherein said processing means performs a correlation operation.

5. A device according to claim 1, wherein said processing means performs a comparison operation.

6. A device according to claim 1, further comprising control means for controlling a focusing operation of said optical means according to an output of said processing means.

7. An image pickup apparatus comprising:

a two-dimensional image sensor for converting an optical image into an electrical signal;

optical means for impinging at least two different optical images on said image sensor;

designating means for variably designating areas within said two-dimensional image sensor, each of said areas receiving one of the at least two different optical images, respectively; and comparing means for comparing electrical signals corresponding to the at least two different optical images.

8. An apparatus according to claim 7, wherein said at least two optical images are images at different positions of the same object.

9. An apparatus to claim 8, wherein said different positions are parallel to each other.

10. An apparatus according to claim 7, wherein said comparing means performs a correlation operation.

11. An image pickup apparatus comprising:

a two-dimensional image sensor having a two-dimensional image sensing surface;

optical means for forming at least two images on said two-dimensional image sensing surface; and designating means for variably designating areas within said two-dimensional image sensing surface, each of said areas receiving one of the at least two optical images, respectively.

12. Apparatus according to claim 11, further comprising adding means for adding information formed in each of said areas.

13. Apparatus according to claim 11, wherein said optical means forms at least two different images on said two-dimensional image sensing surface.

14. Apparatus according to claim 13, wherein said at least two different images are images at different positions of the same object.

15. Apparatus according to claim 11, further comprising processing means for processing outputs of said two-dimensional image sensor.

16. Apparatus according to claim 15, wherein said processing means compares outputs from said areas.

17. Apparatus according to claim 15, wherein said processing means performs a correlation operation.

18. Apparatus according to claim 15, wherein said processing means produces a level detecting signal based on outputs from said areas.

19. Apparatus according to claim 18, wherein said processing means produces a peak level detecting signal based on outputs from said areas.

20. Apparatus according to claim 19, wherein said processing means produces a distance measuring signal based on outputs from said areas.

21. An image pickup apparatus comprising:
   two-dimensional image sensing means for converting optical images into electrical images;
   optical means for forming at least two optical images on said two-dimensional image sensing means;
   designating means for designating areas within said two-dimensional image sensing means, each of said areas receiving one of the at least two optical images, respectively; and
   processing means for detecting a luminance level based on outputs from said areas.

22. Apparatus according to claim 21, wherein said optical means forms at least two different optical images on said two-dimensional image sensing surface.

23. Apparatus according to claim 21, wherein said processing means compares outputs from said areas.

24. Apparatus according to claim 21, wherein said designating means variably designates the areas within said two-dimensional image sensing means.

25. Apparatus according to claim 21, wherein said processing means produces a distance measuring signal based on outputs from said areas.

26. Apparatus according to claim 21, wherein said processing means performs a correlation operation.

27. Apparatus according to claim 21, wherein said at two different optical images are images at different positions of the same object.

28. Apparatus according to claim 21, further comprising adding means for adding information from each of said areas.

29. Apparatus according to claim 21, wherein said processing means detects a peak level based on outputs from said areas.

30. An image pickup apparatus comprising:
   two-dimensional image sensing means for converting optical images into electrical images;
   optical means for forming at least two optical images on said two-dimensional image sensing means;
   designating means for designating areas within said two-dimensional image sensing means, each of said areas receiving one of the at least two optical images, respectively; and
   adding means for adding information formed in each of said areas.

31. Apparatus according to claim 30, wherein said optical means forms at least two different optical images on said two-dimensional image sensing surface.

32. Apparatus according to claim 30, wherein said at least two optical images are images at different positions of the same object.

33. Apparatus according to claim 30, further comprising processing means for processing outputs of said two-dimensional image sensor.

34. Apparatus according to claim 33, wherein said processing means compares outputs from said areas.

35. Apparatus according to claim 33, wherein said processing means produces a distance measuring signal based on outputs from said areas.

36. Apparatus according to claim 33, wherein said processing means performs a correlation operation.

37. Apparatus according to claim 33, wherein said processing means produces a level detecting signal based on outputs from said areas.

38. Apparatus according to claim 37, wherein said processing means produces a peak level detecting signal based on outputs from said areas.

39. Apparatus according to claim 37, further comprising control means for controlling said adding means based on said level detecting signal.

* * * * *

UNITED STATES PATENT AND TRADEMARK OFFICE
CERTIFICATE OF CORRECTION

PATENT NO. : 5,485,004
DATED : January 16, 1996
INVENTOR(S) : KENJI SUZUKI, ET AL.

It is certified that error appears in the above-indentified patent and that said Letters Patent is hereby corrected as shown below:

On the title page: Item

[56] FOREIGN PATENT DOCUMENTS

"63-17209  7/1988  Japan.
 1-27116 10/1989  Japan." should read
--63-172209  7/1988  Japan.
 1-271716 10/1989  Japan.--.

COLUMN 1

Line 51, "the the" should read --the--; and
Line 65, "position" should read --positions--.

COLUMN 2

Line 3, "of" should be deleted;
Line 42, "a." should read --a--; and
Line 43, ""produce" should read --produces--.

COLUMN 3

Line 8, "free." should read --frame.--;
Line 13, "a" should be deleted;
Line 54, "vary" should read --varies--; and
Line 59, "reelection" should read --reflection--.

COLUMN 4

Line 3, "a" should be deleted; and
Line 62, "having" should read --having a two-dimensional--.

UNITED STATES PATENT AND TRADEMARK OFFICE
CERTIFICATE OF CORRECTION

PATENT NO. : 5,485,004
DATED : January 16, 1996
INVENTOR(S) : KENJI SUZUKI, ET AL.

It is certified that error appears in the above-indentified patent and that said Letters Patent is hereby corrected as shown below:

COLUMN 5

Line 15, "the" should read --of the--; and
Line 40, "sensor" should read --sensor in--.

COLUMN 7

Line 42, "define" should read --defined--; and
Line 43, "sensor" should read --sensors--.

COLUMN 8

Line 29, "by-the" should read --by the--.

COLUMN 9

Line 50, "follow" should read --follows--.

COLUMN 10

Line 16, "an" should be deleted.

COLUMN 12

Line 41, "anyway" should be deleted;
Line 42, "enables" should be deleted;
Line 57, "Steps" should read --the steps--;
Line 60, "023" should read --023,--; and
Line 61, "columns" should read --columns,--.

UNITED STATES PATENT AND TRADEMARK OFFICE
CERTIFICATE OF CORRECTION

PATENT NO. : 5,485,004
DATED : January 16, 1996
INVENTOR(S) : KENJI SUZUKI, ET AL.

It is certified that error appears in the above-indentified patent and that said Letters Patent is hereby corrected as shown below:

COLUMN 13

Line 58, "the" should read --in the----; and
Line 67, "area" should read --areas--.

COLUMN 14

Line 8, "Which" should read --which--; and
Line 58, "respective y," should read --respectively,--.

COLUMN 15

Line 37, "reset" should read --resets--.

COLUMN 17

Line 24, "of" should be deleted, and "equipments" should read --equipment--.

COLUMN 18

Line 17, "variable" should read --variably--;
Line 23, "A device" should read --An apparatus--;
Line 26, "A device" should read --An apparatus--;
Line 28, "A device" should read --An apparatus--;
Line 30, "A device" should read --An apparatus--; and
Line 32, "A device" should read --An apparatus--.

UNITED STATES PATENT AND TRADEMARK OFFICE
CERTIFICATE OF CORRECTION

PATENT NO. : 5,485,004
DATED : January 16, 1996
INVENTOR(S) : KENJI SUZUKI, ET AL.

It is certified that error appears in the above-indentified patent and that said Letters Patent is hereby corrected as shown below:

COLUMN 20

Line 1, "at" should read --at least--.

Signed and Sealed this

Fifteenth Day of October, 1996

Attest:

BRUCE LEHMAN

Attesting Officer

Commissioner of Patents and Trademarks